US011104241B2

(12) United States Patent
Chan et al.

(10) Patent No.: US 11,104,241 B2
(45) Date of Patent: *Aug. 31, 2021

(54) METHODS AND SYSTEMS FOR SUPPLYING ELECTRICITY TO MULTIPLE LOADS WITH CURRENT MEASUREMENTS

(71) Applicant: Pismo Labs Technology Limited, Kowloon (HK)

(72) Inventors: Alex Wing Hong Chan, Tai Tam (HK); Ming Pui Chong, Kowloon (HK); King Shan Lam, New Territories (HK); Chi Leong Kwok, Kowloon (HK)

(73) Assignee: PISMO LABS TECHNOLOGY LIMITED, Kowloon (HK)

( * ) Notice: Subject to any disclaimer, the term of this patent is extended or adjusted under 35 U.S.C. 154(b) by 0 days.

This patent is subject to a terminal disclaimer.

(21) Appl. No.: 16/902,834

(22) Filed: Jun. 16, 2020

(65) Prior Publication Data
US 2020/0307404 A1    Oct. 1, 2020

Related U.S. Application Data

(63) Continuation of application No. 16/679,612, filed on Nov. 11, 2019, now Pat. No. 10,682,925, which is a
(Continued)

(51) Int. Cl.
*H02J 7/00* (2006.01)
*H02J 7/14* (2006.01)
(Continued)

(52) U.S. Cl.
CPC ............... *B60L 53/60* (2019.02); *B60L 53/31* (2019.02); *B60L 53/63* (2019.02); *B60L 53/665* (2019.02);
(Continued)

(58) Field of Classification Search
USPC ........................................................ 320/109
See application file for complete search history.

(56) References Cited

U.S. PATENT DOCUMENTS 8,731,730 B2   5/2014  Watkins
8,890,473 B2  11/2014  Muller
(Continued)

FOREIGN PATENT DOCUMENTS

CN       202206160 U    4/2012
CN       103390912 A   11/2013
(Continued)

OTHER PUBLICATIONS

International Search Report in International Application No. PCT/IB2016/055024, dated May 25, 2017.
(Continued)

*Primary Examiner* — Alexis B Pacheco
(74) *Attorney, Agent, or Firm* — Hershkovitz & Associates, PLLC; Abe Hershkovitz

(57) ABSTRACT

To prevent theft and/or leakage of electricity and to distribute electricity for recharging electric vehicles, the present invention discloses methods and systems for enabling and disabling a plurality of relays at a system. The system comprises a power supply, at least one ammeter, a power supply enabler and at least one power controller. The required steps include measuring current drawn by the plurality of loads by one or more ammeters. The power controller independently enables or disables each of the plurality of relays according to the instructions received. The power supply enabler enables or disables power supply to the system substantially based on the amount of current being drawn by the system.

20 Claims, 27 Drawing Sheets

Related U.S. Application Data continuation of application No. 15/545,723, filed as application No. PCT/IB2016/055024 on Aug. 23, 2016, now Pat. No. 10,471,846.

(51) Int. Cl.

| | | |
|---|---|---|
| *B60L 53/60* | (2019.01) | |
| *G06Q 50/30* | (2012.01) | |
| *B60L 53/66* | (2019.01) | |
| *B60L 53/63* | (2019.01) | |
| *G06Q 50/06* | (2012.01) | |
| *B60L 53/31* | (2019.01) | |
| *G01R 19/10* | (2006.01) | |
| *G01R 19/25* | (2006.01) | |

(52) U.S. Cl.
CPC ......... *G01R 19/10* (2013.01); *G01R 19/2513* (2013.01); *G06Q 50/06* (2013.01); *G06Q 50/30* (2013.01); *H02J 7/007* (2013.01); *H02J 7/0026* (2013.01); *H02J 7/0027* (2013.01); *B60L 2240/72* (2013.01); *H02J 7/00034* (2020.01); *H02J 7/00045* (2020.01); *Y02T 10/70* (2013.01)

(56) References Cited

U.S. PATENT DOCUMENTS

| | | | |
|---|---|---|---|
| 9,853,488 | B2 | 12/2017 | Fincham |
| 9,955,428 | B1 | 4/2018 | Bacarella |
| 2007/0067065 | A1 | 3/2007 | El-Gasseir |
| 2010/0164439 | A1 | 7/2010 | Ido |
| 2010/0185405 | A1 | 7/2010 | Aoshima |
| 2010/0301809 | A1 | 12/2010 | Bhade |
| 2011/0016063 | A1 | 1/2011 | Pollack |
| 2011/0144823 | A1 | 6/2011 | Muller et al. |
| 2011/0313652 | A1 | 12/2011 | Hancock |
| 2012/0074876 | A1 | 3/2012 | Redler |
| 2012/0112754 | A1 | 5/2012 | Kawai |
| 2012/0229085 | A1 | 9/2012 | Lau |
| 2012/0268245 | A1 | 10/2012 | Alexander |
| 2012/0277927 | A1 | 11/2012 | Watkins |
| 2012/0278215 | A1 | 11/2012 | Baek |
| 2012/0316717 | A1 | 12/2012 | Daum |
| 2013/0002188 | A1 | 1/2013 | Uyeki |
| 2013/0009598 | A1 | 1/2013 | Ohtomo |
| 2013/0119939 | A1 | 5/2013 | Yonezawa et al. |
| 2013/0184886 | A1 | 7/2013 | Pollack et al. |
| 2013/0320934 | A1 | 12/2013 | Kobayashi |
| 2014/0015974 | A1 | 1/2014 | Nagy |
| 2014/0089016 | A1 | 3/2014 | Smullin |
| 2014/0214224 | A1 | 7/2014 | Watkins |
| 2014/0232320 | A1 | 8/2014 | July |
| 2014/0236379 | A1 | 8/2014 | Masuda |
| 2015/0183333 | A1 | 7/2015 | Forbes et al. |
| 2016/0089994 | A1 | 3/2016 | Keller |
| 2017/0310140 | A1 | 10/2017 | Asghari |
| 2018/0329374 | A1 | 11/2018 | Kelly |
| 2020/0403423 | A1* | 12/2020 | Chan ............... H02J 7/0026 |

FOREIGN PATENT DOCUMENTS

| | | |
|---|---|---|
| CN | 104410089 A | 3/2015 |
| CN | 104467098 A | 3/2015 |
| CN | 104682536 A | 6/2015 |
| CN | 104734304 A | 6/2015 |
| CN | 105703427 A | 6/2016 |
| JP | 2000032681 A | 1/2000 |
| KR | 20140142598 A | 12/2014 |

OTHER PUBLICATIONS

Written Opinion of the international Searching Authority in International Application No. PCT/IB2016/055024, dated May 25, 2017.
International Search Report in International Application No. PCT/IB2016/055025, dated Mar. 1, 2017.
Written Opinion of the international Searching Authority in International Application No. PCT/IB2016/055025, dated Mar. 1, 2017.
English language Abstract of CN 202206160 U (Apr. 25, 2012).
English language Abstract of CN 103390912 A (Nov. 13, 2013).
English language Abstract of CN 104410089 A (Mar. 11, 2015).
English language Abstract of CN 105703427 A (Jun. 22, 2016).
English language Abstract of CN 104682536 A (Jun. 3, 2015).
English language Abstract of JP 2000032681 A (Jan. 28, 2000).
English language Abstract of KR 20140142598 A (Dec. 12, 2014).
English language Abstract of CN 104734304 A (Jun. 24, 2015).
English language Abstract of CN 104467098 A (Mar. 25, 2015).

* cited by examiner

| ID | Time | User | Priority | Load |
|---|---|---|---|---|
| A | Jan 1, 2015, 10:00 -12:00 — 804a | John123 — 805a | Highest priority — 806a | 102a — 807a |
| B | Feb 20, 2015 11:00, 1 hours — 804b | Alex123 — 805b | Second-highest priority — 806b | 102e — 807b |
| C | Everyday, 14:00 2 hours — 804c | Joe325 — 805c | Lowest priority — 806c | 102a, 102b, 102c — 807c |
| D | Every Monday, 14:00-15:00 — 804d | martin101 — 805d | Not specified — 806d | Not specified — 807d |
| E | Anytime — 804e | bigboss — 805e | Highest priority — 806e | Not specified — 807e |

Fig. 8

METHODS AND SYSTEMS FOR SUPPLYING ELECTRICITY TO MULTIPLE LOADS WITH CURRENT MEASUREMENTS

RELATED APPLICATIONS

The present application is a non-provisional Continuation application which claims the benefits of and is based on U.S. application Ser. No. 16/679,612, titled "METHODS AND SYSTEMS FOR SUPPLYING ELECTRICITY TO MULTIPLE LOADS WITH CURRENT MEASUREMENTS", filed on Nov. 11, 2019, which is a non-provisional Continuation application which claims the benefits of and is based on U.S. application Ser. No. 15/545,723, now U.S. Pat. No. 10,471,846, titled "METHODS AND SYSTEMS FOR SUPPLYING ELECTRICITY TO MULTIPLE LOADS WITH CURRENT MEASUREMENTS", filed on Jul. 24, 2017, which claims the benefits of and is based on International Application No. PCT/IB2016/055024, filed on Aug. 23, 2016, the disclosures of which are hereby incorporated by specific reference thereto.

TECHNICAL FIELD

The invention relates to electricity supply distribution technology through one or more power controllers. In particular, this invention relates to distributing electricity when there is an inadequate amount of electricity supply based on a scheduler and ammeter measurement.

BACKGROUND ART

The utility of electric vehicles (EVs), as opposed to the traditional ones, does not depend on the long-established approach of refilling the car petroleum. EVs rely heavily on large rechargeable batteries. Due to the benefit of being more environmentally friendly than non-EVs, there is a significant increase in the popularity in EVs which, at the same time, creates the challenge of having sufficient power supply for recharging EVs through current infrastructure.

The growing popularity in EVs does not only heighten its demand, but also the demand for electricity. However, given the limited supply of electricity at a location supported by current infrastructure, especially in car park areas where electricity is originally designed to be used for lighting rather than recharging cars, distribution of electricity becomes more challenging. As spaces are limited in car parks to install these electric vehicle chargers, so, even if there is an adequate supply of electricity there may be an inadequate number of EV chargers installed. Therefore, it is desirable to have a system to allocate electricity for electric vehicle chargers and to allocate time slots for using the electric vehicle chargers. The following invention can compensate for these limitations as it schedules the available electricity to EV chargers by means of enabling and disabling a plurality of relays. An EV can be authorized and reserved by its user's identity and charged from these EV charging stations in exchange of a payment or other means of cost. By the means of this invention the possibility of its availability can increase from which EV users can benefit.

SUMMARY OF INVENTION

One of the embodiments for power supply to electric vehicle chargers upon receiving instructions from a scheduler server through enabling and disabling a plurality of relays at a system by appropriate use of power controllers to control a plurality of relays and authorizing as well as reserving the electric vehicle chargers for users. The relays may be a standalone apparatus or embedded in an apparatus, such as in electric vehicle chargers. The relays may also be connected and/or coupled to an electric vehicle charger. In one variant, no electricity is provided to a load due to a failed authentication or reach of a second time limit for reservation of a user.

In another embodiment, a system comprises a power supply, at least one ammeter, a power supply enabler and a plurality of power controllers. The first ammeter measures a first amount of current provided by the power supply. The measurement from the ammeter can be used to calculate the payment for using an electric vehicle charger based on the total amount of power consumed. The power supply enabler sends the measurement of the first amount of current provided by the power supply to the remote server. The amounts of current drawn by each of the plurality of loads are independently measured by the plurality of second ammeters respectively. One or more power controllers send measurement of the amount of current drawn by each of the plurality of loads to the remote server which also comprises a scheduler server and an authentication server. The remote server then determines the total amount of current drawn based on the measurement of amount of current drawn by each of the plurality of loads and sends instruction to the power controller. The power controllers enable or disable each of the plurality of relays according to the instructions received. When the amount of current provided by the power supply is more than the total amount of a first threshold, the power supply enabler disables a first relay to stop current being drawn by the power controllers. The power controllers independently disable each of the plurality of the second relays respectively. The first relay is connected in series between the power supply and each of the plurality of the loads respectively. The first total amount of current drawn is based on the sum of amount of current drawn by each of the plurality of loads.

According to one of the embodiments, the remote server comprises an authentication server and a scheduler server. The authorization server is used for authorizing a user and the scheduler server is for scheduling electric vehicle chargers for user's use. In one variant, the remote server is used for establishing time limits while reserving an electric vehicle charger for a user along with informing the location of the electric vehicle charger to the user. The remote server is also used for sending an alert message and canceling the reservation if the first and second time limits are exceeded respectively.

In one of the variants of the present invention, the remote server is the power supply enabler and the instructions are sent and received by using wireless communication technologies.

In one of the variants of the present invention, the remote server sends a dispatch for the purpose of investigating the reason why the first amount of current provided is more than the first total amount of current drawn by the first threshold. The scheduler server which is a part of the remote server also determines which one or more of the plurality of second relays should be enabled or disabled according to a time scheduler and sends instructions to one or more of the plurality of power controllers.

In one of the variants of the present invention, each of the plurality of the power controllers is enclosed in an enclosure independently with a respective second ammeter. A third relay is enclosed in the enclosure and each of the plurality of power controllers enables or disables the third relay by enabling or disabling the second relay.

BRIEF DESCRIPTION OF DRAWINGS

FIG. 8 is a table illustrating one of the formats of a time scheduler created or received by power controller in one of the embodiments of the present invention.

DETAILED DESCRIPTION

Figure 1A:
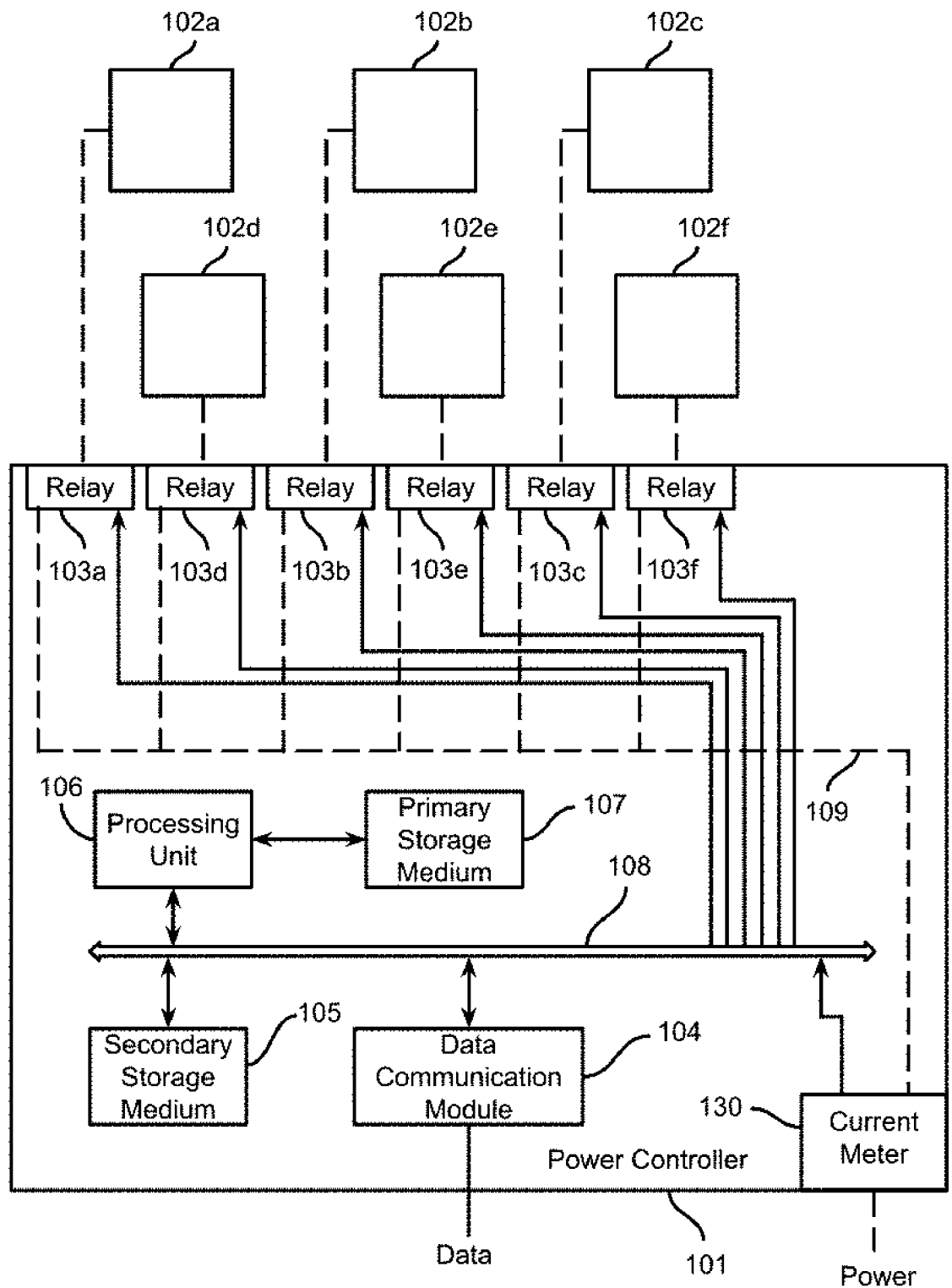
FIG. 1A is a block diagram illustrating that relays that connected to the loads are housed inside the power controller in one of the embodiments according to the present invention.

The ensuing description provides preferred exemplary embodiment(s) only, and is not intended to limit the scope, applicability or configuration of the invention. Rather, the ensuing description of the preferred exemplary embodiment(s) will provide those skilled in the art with an enabling description for implementing a preferred exemplary embodiment of the invention. It is being understood that various changes may be made in the function and arrangement of elements without departing from the spirit and scope of the invention as set forth in the appended claims.

Specific details are given in the following description to provide a thorough understanding of the embodiments. However, it will be understood by one of ordinary skill in the art that the embodiments may be practiced without these specific details. For example, circuits may be shown in block diagrams in order not to obscure the embodiments in unnecessary detail. In other instances, well-known circuits, processes, algorithms, structures, and techniques may be shown without unnecessary detail in order to avoid obscuring the embodiments.

Also, it is noted that the embodiments may be described as a process which is depicted as a flowchart, a flow diagram, a data flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed, but could have additional steps not included in the figure. A process may correspond to a method, a function, a procedure, a subroutine, a subprogram, etc. When a process corresponds to a function, its termination corresponds to a return of the function to the calling function or the main function.

Embodiments, or portions thereof, may be embodied in program instructions operable upon a processing unit for performing functions and operations as described herein.

The program instructions making up the various embodiments may be stored in a storage medium.

The program instructions making up the various embodiments may be stored in a storage medium. Moreover, as disclosed herein, the term "storage medium" may represent one or more devices for storing data, including read-only memory (ROM), programmable read-only memory (PROM), erasable programmable read-only memory (EPROM), random access memory (RAM), magnetic RAM, core memory, floppy disk, flexible disk, hard disk, magnetic tape, CD-ROM, flash memory devices, a memory card and/or other machine readable mediums for storing information. The term "machine-readable medium" includes, but is not limited to portable or fixed storage devices, optical storage mediums, magnetic mediums, memory chips or cartridges, wireless channels and various other mediums capable of storing, containing or carrying instruction(s) and/or data. A machine-readable medium can be realized by virtualization, and can be a virtual machine readable medium including a virtual machine readable medium in a cloud-based instance.

The term computer-readable medium, primary storage medium, main memory, or secondary storage, as used herein refers to any medium that participates in providing instructions to a processing unit for execution. The processing unit reads the data written in the primary storage medium and writes the data in the secondary storage medium. Therefore, even if the data written in the primary storage medium is lost due to a momentary power failure and the like, the data can be restored by transferring the data held in the secondary storage medium to the primary storage medium. The computer-readable medium is just one example of a machine-readable medium, which may carry instructions for implementing any of the methods and/or techniques described herein. Such a medium may take many forms, including but not limited to, non-volatile media, volatile media, and transmission media. Non-volatile media includes, for example, optical or magnetic disks. Volatile media includes dynamic memory. Transmission media includes coaxial cables, copper wire and fiber optics. Transmission media can also take the form of acoustic or light waves, such as those generated during radio-wave and infrared data communications.

A volatile storage may be used for storing temporary variables or other intermediate information during execution of instructions by a processing unit. A non-volatile storage or static storage may be used for storing static information and instructions for processor, as well as various system configuration parameters.

The storage medium may include a number of software modules that may be implemented as software codes to be executed by the processing unit using any suitable computer instruction type. The software code may be stored as a series of instructions or commands, or as a program in the storage medium.

Various forms of computer readable media may be involved in carrying one or more sequences of one or more instructions to the processor for execution. For example, the instructions may initially be carried on a magnetic disk from a remote computer. Alternatively, a remote computer can load the instructions into its dynamic memory and send the instructions to the system that runs one or more sequences of one or more instructions.

A processing unit may be a microprocessor, a microcontroller, a digital signal processor (DSP), any combination of those devices, or any other circuitry configured to process information.

A processing unit executes program instructions or code segments for implementing embodiments of the present invention. Furthermore, embodiments may be implemented by hardware, software, firmware, middleware, microcode, hardware description languages, or any combination thereof. When implemented in software, firmware, middleware or microcode, the program instructions to perform the necessary tasks may be stored in a computer readable storage medium. A processing unit(s) can be realized by virtualization, and can be a virtual processing unit(s) including a virtual processing unit in a cloud-based instance.

Embodiments of the present invention are related to the use of a computer system for implementing the techniques described herein. In an embodiment, the inventive processing units may reside on a machine such as a computer platform. According to one embodiment of the invention, the techniques described herein are performed by computer system in response to the processing unit executing one or more sequences of one or more instructions contained in the volatile memory. Such instructions may be read into the volatile memory from another computer-readable medium. Execution of the sequences of instructions contained in the volatile memory causes the processing unit to perform the process steps described herein. In alternative embodiments, hard-wired circuitry may be used in place of or in combination with software instructions to implement the invention. Thus, embodiments of the invention are not limited to any specific combination of hardware circuitry and software.

A code segment, such as program instructions, may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc. may be passed, forwarded, or transmitted via any suitable means including memory sharing, message passing, token passing, network transmission, etc.

Alternatively, hardwired circuitry may be used in place of, or in combination with, software instructions to implement processes consistent with the principles of the invention. Thus, implementations consistent with principles of the invention are not limited to any specific combination of hardware circuitry and software.

A network interface that may be provided by a node is an Ethernet interface, a frame relay interface, a fiber optic interface, a cable interface, a DSL interface, a token ring interface, a serial bus interface, a universal serial bus (USB) interface, Firewire interface, Peripheral Component Interconnect (PCI) interface, etc.

A network interface may be implemented by a standalone electronic component or may be integrated with other electronic components. A network interface may have no network connection or at least one network connection depending on the configuration. A network interface may be an Ethernet interface, a frame relay interface, a fiber optic interface, a cable interface, a Digital Subscriber Line (DSL) interface, a token ring interface, a serial bus interface, a universal serial bus (USB) interface, Firewire interface, Peripheral Component Interconnect (PCI) interface, cellular network interface, etc.

A network interface may connect to a wired or wireless access network. An access network may carry one or more network protocol data. A wired access network may be implemented using Ethernet, fiber optic, cable, DSL, frame relay, token ring, serial bus, USB, Firewire, PCI, or any material that can pass information. A wireless access network may be implemented using infrared, High-Speed Packet Access (HSPA), HSPA+, Long Term Evolution (LTE), WiMax, General packet radio service (GPRS), Global System for Mobile Communications (GSM), Enhanced Data rates for GSM Evolution (EDGE), Code division multiple access (CDMA), Wi-Fi, CDMA2000, Wideband CDMA (WCDMA), Time Division CDMA (TD-SCDMA), BLUETOOTH, WiBRO, Evolution-Data Optimized (EV-DO); Digital Enhanced Cordless Telecommunications (DECT); Digital AMPS (IS-136/TDMA); Integrated Digital Enhanced (iDEN) or any other wireless technologies. For example, a network interface may be used as a local area network (LAN) interface or a wide area network (WAN) interface.

The term "relay" as disclosed herein represents an electrically operated switch that allows current to flow in a load, e.g., load 102a-102f, depending upon the switch's position or state. A relay can be solid state relay (SSR), mechanical relay, electromechanical relay (EMR) or the SSR which uses power MOSFET in its output elements like, MOSFET relay, photo relay, photo MOS relay, photo MOS switch, photo DMOS-FET relay etc. The relay can be Single and Dual Channel solid state relays in SPST (single pole single throw), SPDT (single pole double throw), DPST (double pole single throw) and DPDT (double pole double throw) combinations, with current ratings all the way from 1.1 mA to 500 A and Isolation Voltage from 200V to 5000V. Nonetheless, relays can "control" larger voltages and amperes by having an amplifying effect because a small voltage applied to a relay's coil can result in a large voltage being switched by the contacts.

As disclosed herein the term "data communication module (DCM)" may represent a transceiver module to provide network capabilities to a power controller or power controller server using 3G, GPRS or GPS modules, through wires or through an Ethernet cable. The DCM allows a processing unit to obtain user information and communications port of the DCM can connect to a personal computer or other power controller or power controller server (PCS) through wires or wirelessly by using serial bus or Ethernet or using 2G/3G/4G or LTE technology. The DCM can be used as a network interface for applications that require data to be shared between a power controller and an intelligent device such as a host computer and/or a server.

The DCM can be an optical data communication system; an opto-electronic transceiver module may include a light source such as a laser, and a light receiver such as a photodiode, and may also include driver and receiver circuitry associated with the laser and photodiode. To use such an opto-electronic transceiver module, an optical fiber cable is plugged into a port in the module. Such a module also includes electrical contacts that can be coupled to an external electronic system.

Embodiments, or portions thereof, may be embodied in a computer data signal, which may be in any suitable form for communication over a transmission medium such that it is readable for execution by a functional device (e.g., processing unit) for performing the operations described herein. The computer data signal may include any binary digital electronic signal that can propagate over a transmission medium such as electronic network channels, optical fibers, air, electromagnetic media, radio frequency (RF) links, and the like, and thus the data signal may be in the form of an electrical signal, optical signal, radio frequency or other wireless communication signal, etc. The code segments may, in certain embodiments, be downloaded via computer networks such as the Internet, an intranet, LAN, metropolitan area network (MAN), wide area network (WAN), the public switched telephone network (PSTN), a satellite communication system, a cable transmission system, and/or the like.

Figure 6A:
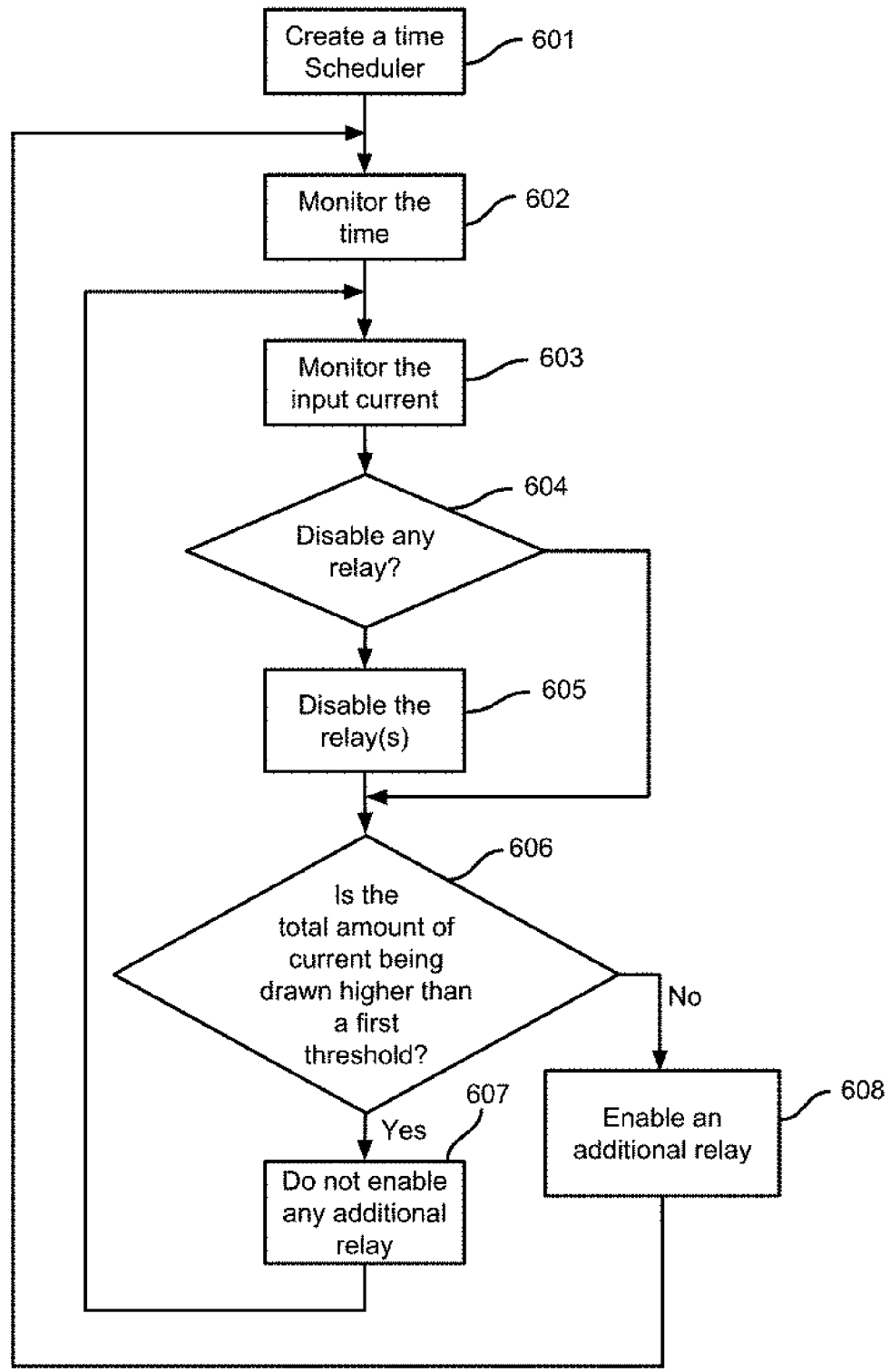
FIG. 6A is a flowchart illustrating a process according to a plurality of the embodiments of the present invention.

FIG. 6A is a flowchart illustrating a process according to a plurality of the embodiments of the present invention. In this embodiment, relay is enabled to provide electricity to the load corresponding to the relay when the relay is scheduled to be enabled and when there is adequate current. FIG. 6A is viewed in conjunction with FIG. 1A for better understanding of the embodiment. In one example, loads 102a-102f are electric vehicle (EV) chargers. This embodiment determines scheduling electric vehicle charger(s) to be provided with electricity for charging electric vehicle(s). As the amount of electricity available may not be adequate to charge every electric vehicle at the same time, power controller 101, based on many criteria, enabling relays connected to electric vehicle chargers to charge electric vehicles in a scheduled manner that some electric vehicles will be charged first while some electric vehicles will be charged later. It is also possible that some electric vehicles may not be fully charged due to inadequate amount of time scheduled to electric vehicle charger, safety reason, competition of time and electricity and other electric vehicles.

Decisions made by processing unit 106 are mainly based on instruction codes and data stored at secondary storage medium 105 and primary storage medium 107. Primary storage medium 307a, and 367 are same as primary storage medium 107 and secondary storage medium 305a, and 365 are same as secondary storage medium 105. In one variant, when data stored in the primary storage medium is lost due to a momentary power failure and the like, the data can be restored by transferring the data held in the secondary storage medium to the primary storage medium. Processing unit 106 retrieves current measurement from ammeter 130 through data bus 108. Processing unit 106 controls relays 103a-103f through data bus 108. In one variant, processing unit may use other connections to control relays 103a-103f and not use data bus 108. Wires 109, 120, 219, 911, 912, 911a, 912a, 911b, 912b, 485b, 486b, 932b etc. are carrying electrical current which may include any type of electrical conductor, such as a high power conductor, feeder, transformer winding, etc. Data bus 108, 308a, 369 is shared by processing unit 106, 306a and 366, secondary storage medium 105, 305a and 365 and plurality of relays respectively where processing unit 106, 306a and 366 provides specialized signals to facilitate the data bus sharing. In one variant, the plurality of relays connects to processing unit 106 through their own data connections that the plurality of relays does not connect to data bus.

In step 601, the process starts where power controller 101 creates a time scheduler. There are myriads of ways to create a time scheduler. For example, the time scheduler is created by an administrator of power controller 101. In another example, the time scheduler is retrieved by power controller 101 from a user input interface. In another example, the time scheduler is retrieved by power controller 101 from a remote host. In another example, the power controller 101 is interfaced with a mobile host, such as a Smartphone and a laptop, to receive an input from a user and then create the time scheduler based on user input. The time scheduler can be updated periodically or any time.

At step 602, time is being monitored. When the time matches a specific time, according to the time slot in the time scheduler, step 603 will be performed. If the time does not match a specific time, step 603 will not be performed. For example, if one of the time slots is 2:00 p.m. and the time is 2:00 p.m., step 603 will then be performed. In another example, if one of the time slots is 2:00 p.m. to 2:10 p.m. and the time is 2:05 p.m., step 603 will also be performed.

At step 603, total amount of current being drawn by power controller 101 is monitored. The current monitoring is performed by an ammeter, such as ammeter 130. Depending on the type of current provided, ammeter 130 can be an AC ammeter or a DC ammeter. The purpose of ammeter 130 is to measure the input current, which is the amount of total amount of current being drawn by power controller 101. As power controller 101 distributes electricity to loads 102a-102f, the total amount of current being drawn by power controller 101 is equal to or more than the total amount of current being drawn by loads 102a-102f as power controller 101 also consumes electricity. It is preferred that power controller 101 ensures that the total amount of current being drawn is within the limit it can handle. If there is too much current being drawn, hazards may occur.

At step 604, power controller 101 identifies if none of, one of, a plurality of or all of the relays 103a-103f has to be disabled. If a relay is already disabled, it will remain disabled. At step 605, power controller 101 disables the identified relays. The criteria to determine which relays need to be disabled. The criterion includes: arrival of a scheduled time, a load is no longer drawing current, a load has been drawing too much current, not adequate current, current re-balancing, administrator's decision, user's decision, authentication failure, environmental factors, etc.

FIG. 8 illustrates one of the formats of a time scheduler created or received by power controller 101 in one of the embodiments. The information stored in the time scheduler can be in the format of digits, numbers, strings, texts, and date, and can be stored in a database or a file locally in a secondary storage medium or remotely at a storage medium of power controller server or remotely at a storage medium of a server. The time scheduler contains a plurality of time slots for processing unit to enable and disable relays. For example, time scheduler comprises identity column 804, time column 801, user column 802, priority column 803 and load column 810. Identity column 804 comprises a unique identity for a row; time column 801 comprises a plurality of time slots 804; user column 802 comprises a plurality of user slots 805; priority column 803 comprises a plurality of priority slots 806; and load column 810 comprises the identity of the loads to be receiving electricity. Time slots 804 are used to indicate the time period or the starting time that a load should be provided with electricity. The time period can be entered by the administrator of power controller 101 or by a user. For example, a user with identity "John123" may request for the time period 10 am to 12 pm at Jan. 1, 2015 for load 102a with highest priority. Therefore "Jan. 1, 2015, 10:00-12:00" is stored in the time slot 804a; "John123" is stored user slot 805a; "102a" is stored at load slot 807a; and "Highest priority" is stored in priority slot 806a. In another example, a user with identity "martin101" may need to charge his electric vehicle, which is a load in this example, every Monday between 14:00 and 15:00 without priority and identity load being specified. Therefore "Every Monday, 14:00-15:00" is stored in the time slot 804d; "martin101" is stored at user slot 805d and "Not specified" are stored in priority slot 806d and load slot 807d. When the scheduled time arrives, i.e. 14:00-15:00 every Monday, "martin101" is able to receive electricity at any of loads 102a-102f if there is enough electricity. It is no limitation that the format for time, user identity, priority, and load identity and database structure must follow the examples illustrated in time scheduler 800. As long as power controller 101 can rely on the information stored in the time scheduler to determine when to provide electricity to a load by enabling a relay, any format and database structure are acceptable.

In another example, a user with identity "bigboss" in user slot 805e has the highest priority in priority slot 806e to receive electricity at any time as indicated in time slot 804e. When the user has authenticated himself and indicates which load to be used, power controller 101 will disable relays of other loads if necessary for lowering total amount of current being drawn to be below the first threshold and then enable the relay of the load indicated by user "bigboss".

At step 606, when the input current is more than a first threshold, power controller 101 will not enable any additional relay at step 607 in order not to increase the amount of current drawn. If the input current is less than the first threshold, power controller 101 will enable an additional relay at step 608 and this may increase the amount of current drawn. If the value of the first threshold is set too high, too much current may be drawn and cause hazard, such as fire hazard. If the value of the first threshold is set too low, not many loads can be provided with electricity and may reduce the commercial effectiveness of power controller 101. It is recommended to set the first threshold not more than 80-95% of the amount of current that may cause hazard.

At step 608, power controller 101 determines the relay to be enabled. Power controller 101 may determine based on one criterion or multiple criteria. For example, power controller 101 determines to enable one or more relays according to the time scheduler. The relay that has the highest priority in the time scheduler is enabled. Therefore, the load connected to the relay can receive electricity. The priority can be based on time. For example, if relay 103a has the highest priority, and then it is enabled before other relays are enabled. Electricity can then be provided to load 102a i.e. the scheduled electric vehicle charger. In one variant, the priority can be based on a plurality of parameters, such as time, payment, user identity, estimated current to be drawn and administrator's decision.

In one variant, power controller 101 may enable a relay even if the scheduled time to enable the relay has not arrived at step 602. For example, after enabling the relay 103a at step 608, steps 602 and 603 are performed, power controller 101 will determine if there is an adequate amount of current to enable any of relays 103b-103f. If it is found that there is an adequate amount of current for one of relays 103b-103f, power controller 101 will enable that relay at step 608 to supply electricity to the load associated with user 805d even though the scheduled time for user 805d has not started yet.

For example, power controller 101 may enable the relay according to the time scheduler and the estimated additional amount of current to be drawn. For illustration purpose, relay 103b is the relay that should be enabled according to the time scheduler. If relay 103b is enabled, load 102b may start drawing current. The amount of current drawn by 102b plus the total amount of current being drawn could be too much and cause hazard as a result. In such case, relay 103b should not be enabled even it is scheduled to be enabled. Therefore, the expected amount of current to be drawn by a load is important to assist power controller 101 to determine which relay can be turned on. In the case that the total amount of current being drawn plus the estimated additional current to be drawn after relay 103b is enabled is still within a safety threshold, relay 103b can be enabled as scheduled.

As it is possible that after the additional relay is enabled at step 608, the load connected to the additional relay may draw an amount of current to cause the total amount of current being drawn increased to a level higher than the first threshold. This may not be desirable as the total amount of current being drawn may have been increased to a level that may cause hazard. Therefore, it is preferred that only relays of loads, which will not draw too much current, should be enabled at step 608. In one variant, the value of the first threshold is set lower to a level that even if a relay is enabled, the additional amount of current to be drawn by the load connecting to the relay will still not cause the total amount of current being drawn to be over the safety threshold.

At step 607, as the total amount of current being drawn is higher than the first threshold, no additional relay is enabled even if there is a relay scheduled to be enabled. For example a scheduled electric vehicle charger for receiving electricity will not receive electricity or adequate current. This reduces the chance that too much current is being drawn by power controller 101.

After steps 607 and 608 are performed, steps 602 and 603 are performed. There is no limitation that steps 602 and 603 must be performed in sequence. Both steps 602 and 603 can be performed at the same time or in inverse order. As the input current at step 603 can be measured by an ampere meter and the ampere meter reports the amount of input current information to the processing unit of power controller 101, the processing unit may receive the amount of input current information at any time. Similarly, as power controller 101 may have an internal clock to monitor time, the time information may be received by processing unit at any time. Therefore when the input current is not higher than the first threshold at step 606, step 608 can then be performed without waiting for a scheduled time according to the time scheduler.

It is possible that after step 608 is performed, the amount of input current is still lower than the first threshold. In such case, one or more relays can be enabled by power controller 101 in order to allow electricity be provided to one or more loads. Furthermore, one or more loads may stop drawing current even the corresponding relays are enabled. This may result in lowered amount of input current.

There can be many levels of priorities to provide flexibility to users and power controller 101 to determine which load(s) should have higher priority to receive electricity at a certain time. For example, a time slot marked with "highest priority" will have the highest priority among all time slots. In one example, the user who has paid more money for the time slot will have higher priority. In another example, the user who has been using the power controller the most frequent will have higher priority.

In one example, when two users have the same priority reserved for the same time for receiving electricity but power controller 101 is only capable of providing electricity to one load, power controller 101 will provide electricity to the load which the user arrives at his/her corresponding load first. In one variant, the user's load that require less usage time will be provided electricity first. For example, a scheduled electric vehicle charger i.e. the load will charge that electric vehicle that requires less time, first. The other electric vehicle will be charged after the first electric vehicle has been fully charged. In one variant, the time for receiving electricity will be divided equally.

For illustration purpose, users of loads 102b, 102c and 102d all reserved the same time slot between 10:00 a.m. to 1:00 p.m. for receiving electricity. When the scheduled time has arrived, however, power controller 101 has determined that it can only provide electricity to one of loads 102b, 102c and 102d as the total amount of current being drawn will be higher than the first threshold after enabling one of relays 103b, 130c and 103d. Then power controller 101 will modify time scheduler 800 by adding three rows with time slots "10:00-11:00", "11:00-12:00", and "12:00-13:00" at time column 801 according to the user's identity at three slots of user column 802 and loads 102b, 102c, and 102d respectively at three slots of load column 810 respectively. As a result, loads 102b, 102c and 102d can equally receive one hour of electricity.

In one of the embodiments of the present invention, a priority is assigned on each user slot e.g., 805a to 805d. Priorities are stored in priority slots 803 for each user respectively. The priorities can be assigned by the administrator or can be defined by the user. For example, the administrator may define that a user, e.g., "John123" 805a has the highest priority and another user, e.g., "Alex123" 805b has the second highest priority. The processing unit will determine which user has the highest priority and will enable the relay associated with that user according to the time scheduler.

Figure 6B:
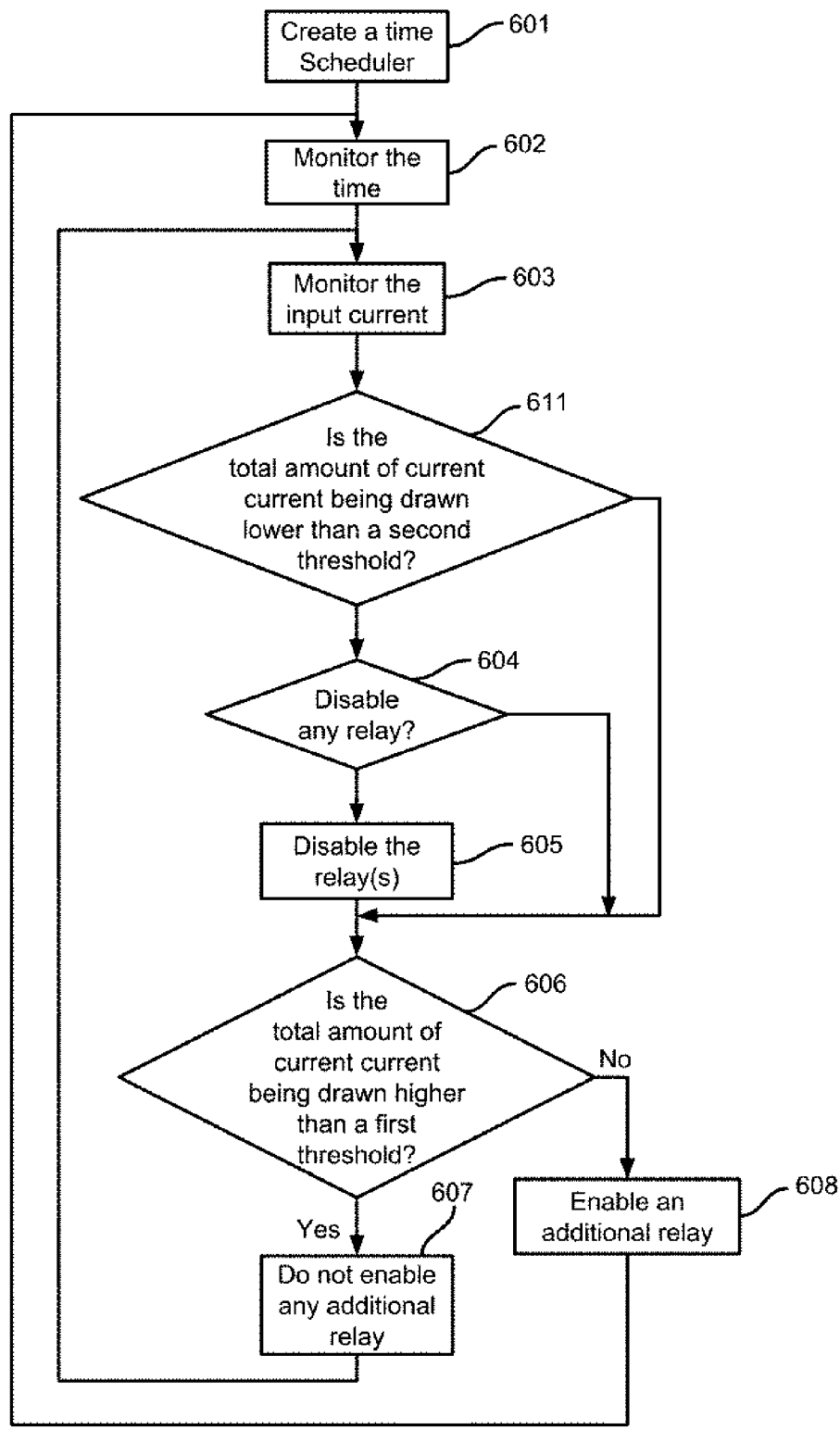
FIG. 6B is a flowchart illustrating a process of disabling one or more relays if the total amount of current that is being drawn by the power controller is higher than a second threshold in order to reduce the total amount of current drawn in one of the embodiments of the present invention.

In one variant, as illustrated by FIG. 6B, one or more relays will be disabled if the total amount of current being drawn by power controller 101 is higher than a second threshold in order to reduce the total amount of current being drawn. Comparing to FIG. 6A, step 611 is added. The purpose of the second threshold is mainly for safety reason to avoid too much total amount of current being drawn. The second threshold should be higher than the first threshold; otherwise one or more relays may be toggled continuously. To illustrate why the second threshold should be higher than the first threshold, the first threshold and second threshold can be set to 20 amperes and 15 amperes respectively. When the total amount of current being drawn is higher than 15 amperes, a relay is disabled at step 612. This may lower the total amount current to be lower than the second threshold.

Then power controller 101 allows step 608 to be performed after step 606. After the relay is enabled, the total amount of current being drawn may be higher than 15 amperes as a load corresponding to the relay just enabled may start drawing current. Then step 605 is performed again as the total amount of current being drawn becomes more than the second threshold again. Therefore, in order to reduce the chance of toggling one or more relays continuously, the second threshold is preferred to be higher than the first threshold. It is preferred that the value of the first threshold should be set to a value that after a relay is turned on, the additional current being drawn by the load corresponding to the relay should not cause the total amount of current being drawn be more than the second threshold to avoid the toggling continuously.

It is preferred to disable a relay that results in reducing the total amount of current being drawn to be lower than the second threshold. If after a relay is disabled, the total amount of current being drawn measured at step 603 is still more than the second threshold, step 605 will then be performed again and one or more additional relays will then be disabled until the total amount of current being drawn is lower than the second threshold.

Figure 1B:
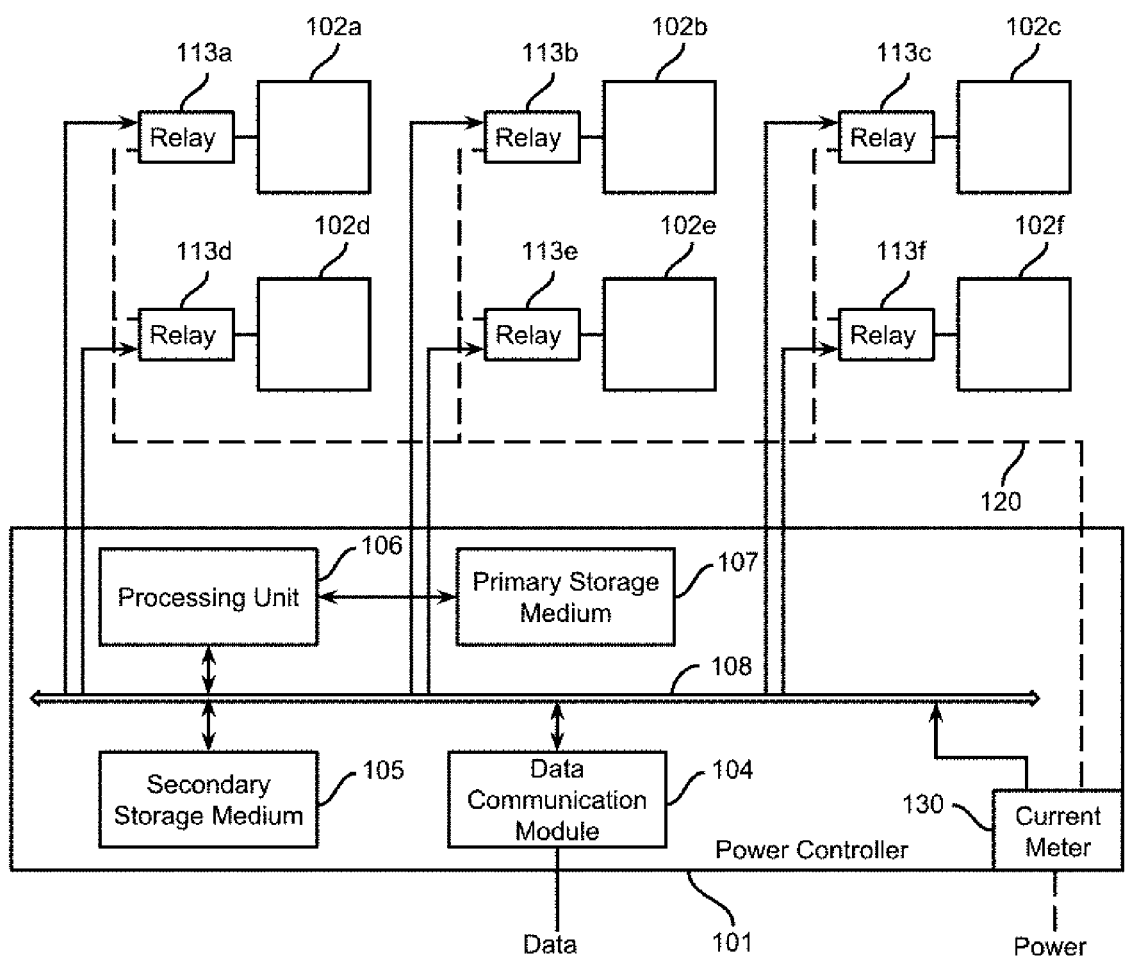
FIG. 1B is a block diagram illustrating that relays that connected to the loads are housed outside the power controller in one of the embodiments according to the present invention.

FIG. 1B illustrates one of the embodiments according to the present invention. The processes illustrated in FIG. 6A and FIG. 6B is applicable in this embodiment. The differences between the embodiments of FIG. 1A and FIG. 1B are that relays that connected to the loads are now not housed in power controller 101, but outside of the power controller 101. The benefits of having relays 113a-113f not housed in power controller 101 include allowing the installation of relays 113a-113f at different locations from the power controller 101. For example, power controller 101 is located at a data room while relays are located at different part of a parking lot. Data communications between power controller 101 and relays 113a-113f can be implemented with wired communications or wireless communications, such as wire connection without communication protocol, Ethernet, Wi-Fi, RS-232 and RS-485. The choice of relays 113a-113f may be different from relays 103a-113f as relays 103a-103f are in closer proximity to data bus 108.

Ammeter 130 is connected to relays 113a-113f through wire 120. When loads 102a-102f are drawing current through corresponding relays 113a-113f, ammeter 130 is able to measure the total amount of current being drawn. Wire 120 may be very long, in terms of tens to hundreds of meters in order to connect to all relays 113a-113f.

Figure 2:
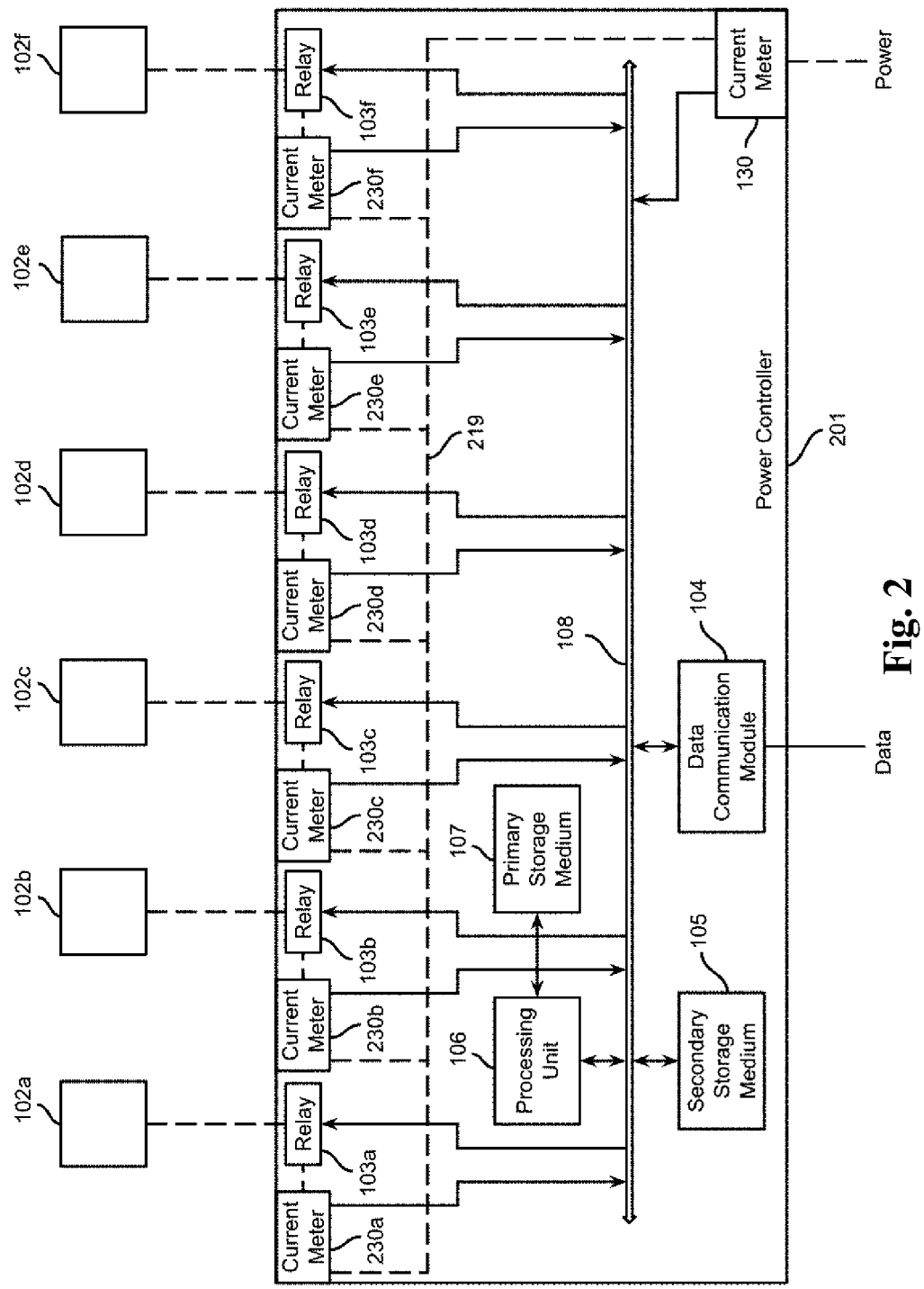
FIG. 2 is a block diagram illustrating a plurality of relays that are connected to the loads are housed outside the power controller in one of the embodiments according to the present invention.

FIG. 2 illustrates one of the embodiments according to the present invention. The processes illustrated in FIG. 6A and FIG. 6B are applicable in this embodiment. One of the differences between the embodiments of FIG. 1A and FIG. 2 are ammeters 230a-230f. Comparing to only relying on ammeter 130 to measure the total amount of current being drawn, ammeters 230a-230f allow PCS 201 to generally know the amount of current being drawn by a specific load. For example, when loads 102a is drawing current, ammeter 230a is capable of measuring the amount of current being drawn by load 102a. This helps to determine the relay to be enabled or disabled at steps 605 and 608 respectively.

In order to measure currents, ammeters 230a-230f are connected in series between relays 103a-103f and ammeter 130 respectively. This is different from the connections in FIG. 1A and FIG. 1B where relays 103a-103f are connected to ammeter 130 without passing through ammeters 230a-230f. Values of current measured by ammeters 230a-230f are reported back to processing unit 106. Ammeters 230 may connect to processing unit through a data bus, RS 232, USB, GPIO and other common interfaces. In one variant, ammeters 230a-230f are connected to the interface through a multiplexer such that ammeters 230a-230f do not connect to processing unit 106 directly and results in saving wiring space and interfaces. Processing unit 106 can control the multiplexer by sending a signal to the multiplexer, like pulling the inputs of multiplexer to high or low, when retrieving current measurement from one of ammeters 230a-230f.

In one variant, ammeter 130 can be omitted from the embodiments illustrated in FIG. 2. The sum of current measured by ammeters 230a-230f should be slightly smaller than or approximately the same as the current measured by ammeter 130 as most current supplied through power controller 201 are for loads 102a-102f.

Figure 6C:
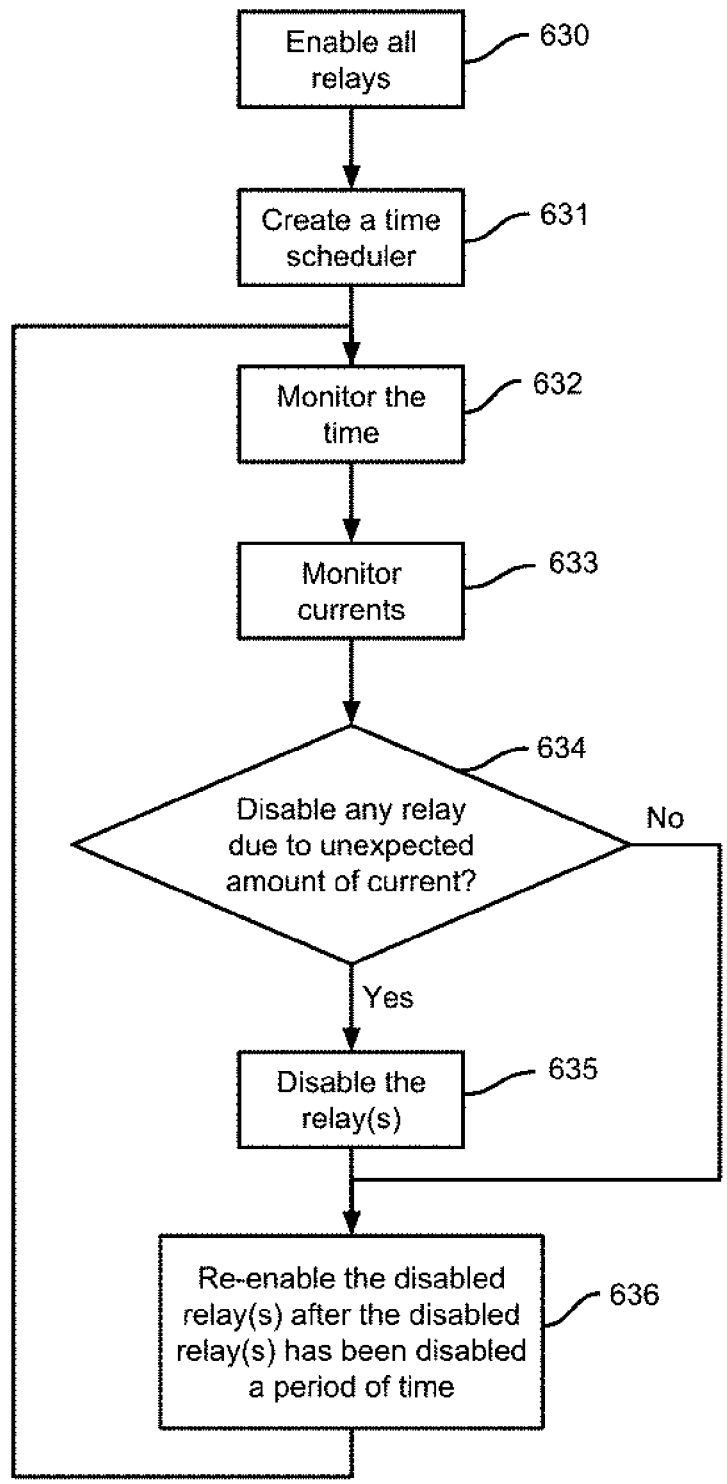
FIG. 6C is another flowchart illustrating a process according to a plurality of the embodiments of the present invention.
Figure 7:
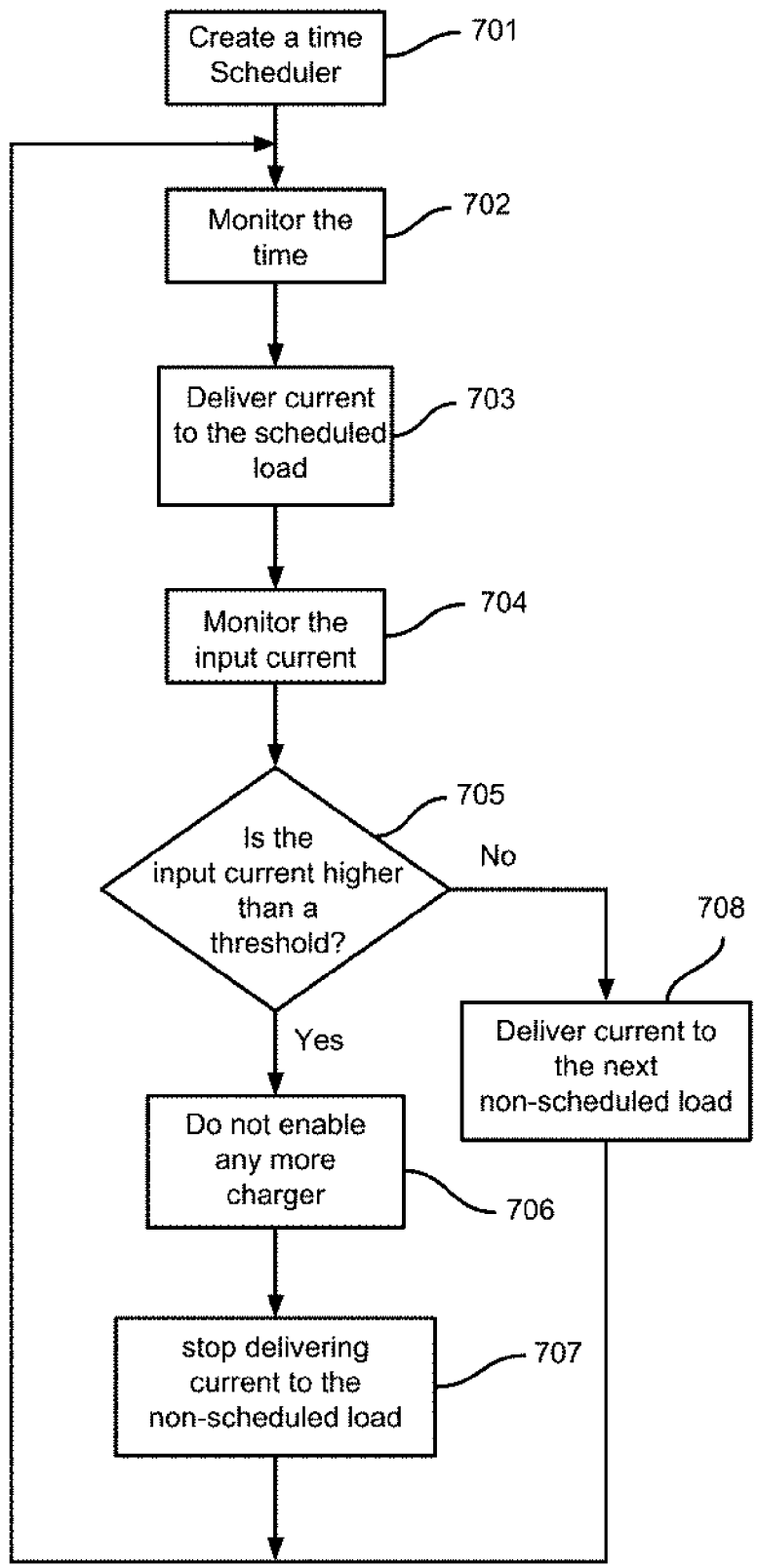
FIG. 7 is another flowchart illustrating a process according to a plurality of the embodiments of the present invention.

FIG. 6C illustrates one of the embodiments of the current invention. The processes illustrated in FIG. 6C should be viewed in conjunction with FIG. 2. All relays 103a-103f are enabled at step 630. At step 631, a time scheduler is created. Then currents are being monitored by ammeters 230a-230f at step 633. At step 634, it is determined whether any amount of current measured by an ammeter is unexpectedly more than the expected threshold, and if so, the corresponding relay will be disabled at step 635. The expected threshold is based on whether more electricity should be provided to a load at a time, which is specified by the time scheduler. The time monitored at step 632 is used for processing unit 106 to determine the expected threshold according to the time scheduler. For illustration purpose, the expected threshold is 0.2 A for loads 102a-102f when a load is not scheduled to provide electricity to charge electronic vehicles. The expected threshold becomes 30 A when a load is scheduled to provide electricity to charge electronic vehicles. In one example, when there is no scheduled electric vehicle to be charged at load 102a, the expected threshold for ammeter 230a is 0.2 A. However, if ammeter 230a reports that the current measured is about 2 A, such case that is more than the expected threshold. Therefore, processing unit 106 will disable relay 103a to cut off electricity provided to load 102a. This is a precaution for safety as well as for security purpose. After a period of time, relay 103a is re-enabled to provide electricity to load 102a at step 636. If ammeter 230a still reports that the amount of current measured is more than the expected threshold, relay 103a will be disabled again. In another example, when there is an electric vehicle scheduled to be charged at load 102b, the expected threshold for ammeter 230a is 30 A. If ammeter 230b reports that the current measured is about 35 A, such case that is more than the expected threshold. Therefore, processing unit 106 will disable relay 103b to cut off electricity provided to load 102b. After a period of time, relay 103a is re-enabled to provide electricity to load 102b at step 636. If ammeter 230b still reports that the current measured is more than the expected threshold, relay 103b will be disabled again. In one example, the non-scheduled electric vehicle charger, which is load 102c, is not to provide electricity for charging an electric vehicle but a user attempts to charge his electric vehicle at load 102c. Then the amount of current being drawn becomes more than the expected current 0.2 A. Therefore, processing unit 106 will disable relay 103c.

The processes illustrated in FIG. 6C allow different amount of maximum current to be provided to loads under different circumstances. This provides a more flexible scheme for providing electricity to loads. The small amount of current allowed to be provided to loads 102a-102f enable electronic devices, such as electric vehicle charger, processing units, sensors and/or camera even when no electric vehicle is scheduled to be charged. This allows the surroundings of the electric vehicle charger to be monitored through the electronic devices. These electronic devices should require less amount of current compared to the amount of current needed for charging an electric vehicle.

Figure 3A:
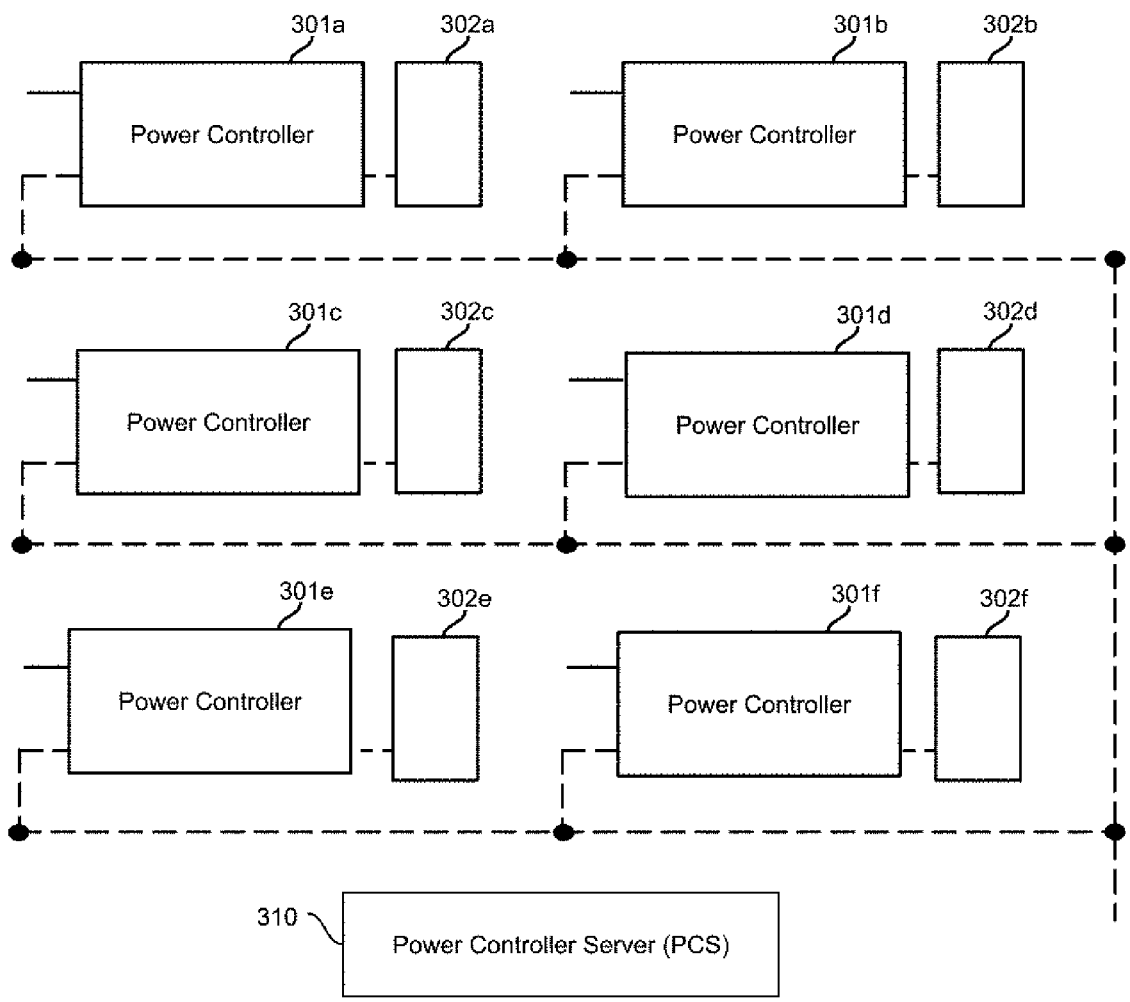
FIG. 3A is a block diagram illustrating one power controller to control one relay to supply electricity to one load in one of the embodiments according to the present invention.
Figure 3B:
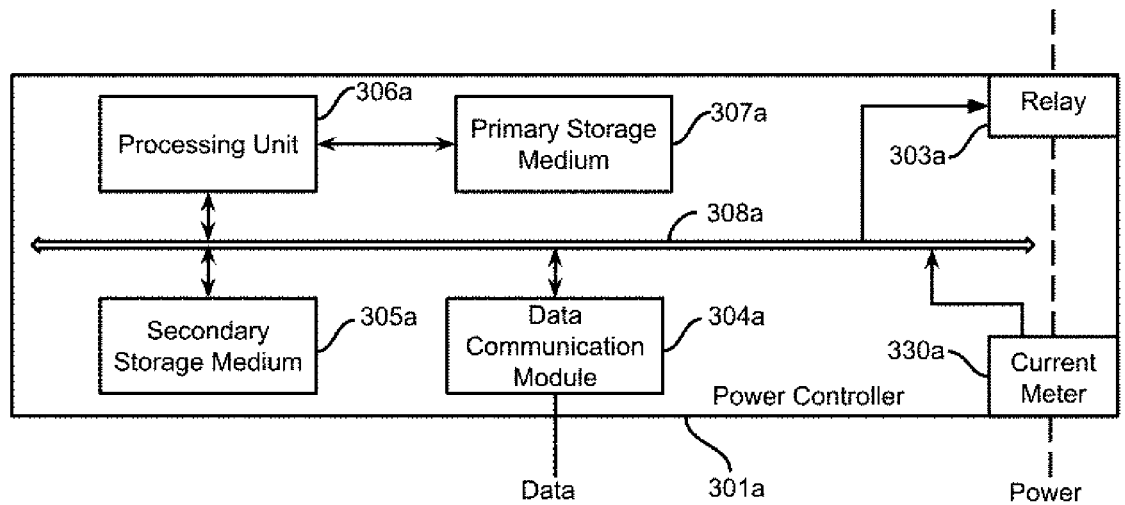
FIG. 3B is a block diagram of a power controller according to one of the embodiments of the present invention.

FIGS. 3A and 3B together illustrate one of the embodiments according to the present invention. Power controllers 301 perform functions similar to power controller 101 and each comprises a relay and an ammeter. The embodiments illustrated in FIG. 1 rely on one power controller to control electricity supply to all loads and control all relays while embodiments illustrated by FIGS. 3A and 3B have one power controller to control one relay to supply electricity to one load. Unlike the embodiments illustrated in FIG. 1, power controllers 301a-301f do not determine solely whether to enable and disable their respective relays 303, power controllers 301a-301f communicate with power controller server (PCS) 310 before enabling or disabling their respective relays. FIG. 3B illustrates the architecture of power controller 301a. Processing unit 306a performs similar functions of processing unit 106 but only controls one relay, i.e. relay 303a. Ammeter 330a measures the amount of current supplied to load 302a and reports the amount of current to processing unit 306a. This embodiment allows power controllers 301 to be placed closer to loads 302 respectively. Furthermore, it may be easier to operate comparing to the embodiment of FIG. 1A as each of power controllers 301 may be installed and removed individually without affecting other power controllers. For example, power controller 301a may be moved from one location to another location without shutting down PCS 310 and power controllers 301b-301f. Further, in one example, the number of power controllers 301 can be installed gradually in a parking lot instead of installing all of them at the same time. Comparing to power controller 101, power controller 101 has a limitation of number of loads that can be connected to due to the number of relays housed and the amount of current passing through it. However, PCS 310 is not required to have a relay as power controllers 301 is housed with the relay and current supplied to loads 302 are not passing through PCS 310.

Figure 3C:
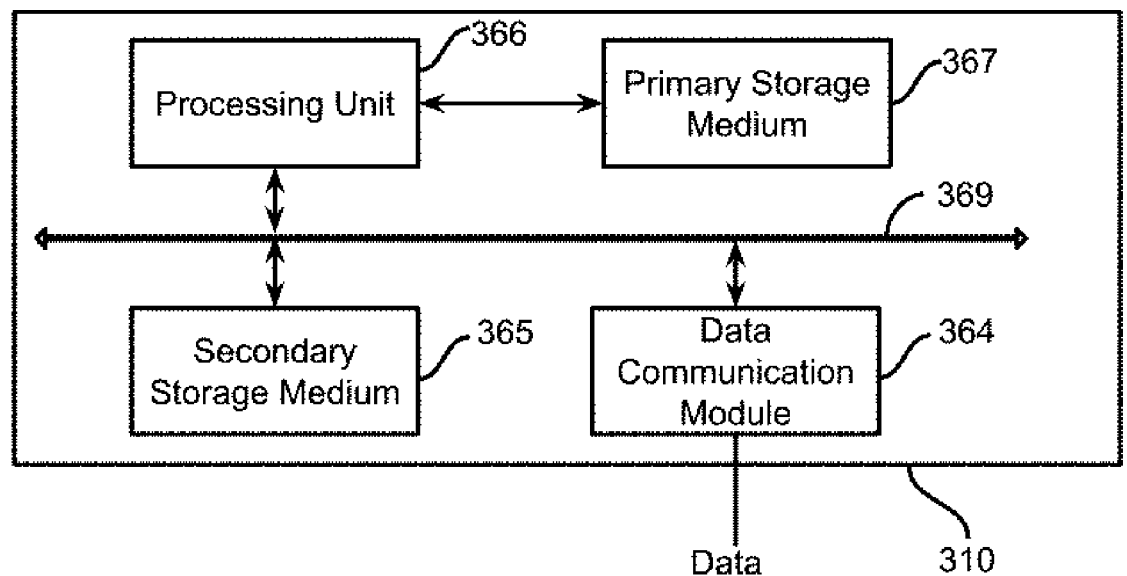
FIG. 3C is another block diagram of a power controller according to one of the embodiments of the present invention.

Data communication module 304a performs differently from data communication module 104 although the same hardware can be used to realize the functions of data communication modules 104 and 304a. Data communication module 304a is mainly responsible for communicating with PCS 310. Data communication module 364 as illustrated in FIG. 3C is same as data communication module 304a of FIG. 3B. Therefore, processing unit 306a can control relay 303a substantially based on the instructions received from PCS 310 through data communication module 304a. Furthermore, current measured by ammeter 330a can also be reported by processing unit 306a through data communication module 304a. In one variant, power controller 301a communicates with other power controllers through data communication module 304a without using PCS 310. This may allow power controller 301a to determine the total amount of current being drawn to power controllers 301a-301f even when PCS 310 is out of order. Power controllers 301a-301f can communicate among them to determine which of relays 303a-303f should be enabled and disabled. The total amount of current being drawn should be lower than a threshold, such that no hazard is caused.

There is no limitation that power controllers 301a-301f must be identical. They may be manufactured by the same manufacturer or different manufacturers. However, it is important that power controllers 301a-301f are capable of communicating with each other to determine which relays should be turned on and off while keeping the total amount of current being drawn within a safety threshold.

The processes illustrated in FIG. 6A also apply with FIG. 3A. Unlike power controller 101 in FIG. 1A, processes in FIG. 6A may be performed by power controllers 301a-301f and PCS 310 together. The time scheduler at 601 is retrieved by processing unit of PCS 310. PCS 310 then sends instructions to power controller 301a-301f based on the information in time scheduler. Step 602 can be performed by PCS 310 or each of power controller 301a-301f. For example, when PCS 310 perform step 602, it sends instruction to one or more power controllers 301a-301f based on the time. In another example, a time scheduler is already sent to power controller 301a by PCS 310 after step 601 and power controller 301a performs step 602 by itself. At step 603, processing unit of power controllers 301, such as processing unit 306a, receives the current measurement from one or more ammeters, such as ammeter 330a, and sends the current measurement to PCS 310 through data communication module 304a. Based on the time scheduler and current measured at each of the power controllers 301, PCS 310 is capable of determining the relays to be disabled at step 604. PCS 310 then sends instruction(s) to power controller 301 associated with the relays to be disabled to disable the relays. Processing units of the corresponding power controllers 301 then disable the relays at step 605.

At step 606, when the input current is more than a first threshold, PCS 310 will not enable any additional relay at step 607 in order not to increase the current drawn. If the input current is less than the first threshold, PCS 310 will determine the additional relay to be enabled and send an instruction to the power controller associated with the additional relay. For example, based on the time scheduler, load 302d will be provided with electricity. Therefore, PCS 310 sends an instruction to power controller 301d to enable the relay of power controller 301d at step 608. Power controller 301d receives the instruction through data communication module 304d.

The criterion/criteria used by power controller 101 in FIG. 1A to determine which relays to be enabled can also be used by PCS 310.

After steps 607 and 608 are performed, steps 602 and 603 are performed. The current measured by ammeters of respective power controller 301a-301f are sent to PCS 310 preferred periodically. This allows PCS 310 to have the updated current measurement information for determining the amount of additional current that can be provided to a load while taking the first threshold into account. In one variant, when a processing unit of a power controller identifies that the amount of current measured by its corresponding ammeter has an unexpected sudden increase or is over a certain threshold, the processing unit will report the current measurement back to PCS 310. This allows PCS to calculate a more updated total amount of current being drawn in order to prevent hazard.

It is possible that after step 608 is performed, the amount of input current is still lower than the first threshold. In such case, one or more relays can be further enabled by power controllers 301 in order to allow electricity be provided to one or more loads. Further, one or more loads may stop drawing current even when the corresponding relays are enabled. This may result in lowered amount of input current.

As demonstrated that processes illustrated in FIG. 6A, are also applicable for the embodiment illustrated in FIG. 3A. Processes illustrated in FIG. 6B are also applicable for the embodiment illustrated in FIG. 3A.

FIG. 4A-4D illustrate four circuitry examples of implementing a power controller, such as power controller 101, 201 and 301. Processing units, primary storage medium, secondary storage medium, data communication module are grouped together and illustrated as processing module 402 in FIG. 4A-4D for readability. Power controllers 401, 421, 441 and 461 all house processing module 402 respectively. Power supplies 411, 431, 451 and 481 provides electricity to power controllers 401, 421, 441 and 461 and respective processing module 402. Ground connections 412, 432, 452 and 482 are grounds for power controllers 401, 421, 441 and 461 respectively. The type of current supplied to processing module 402 is direct current. In case the type of current of powers 411, 431, 451 and 481 is an alternating current, a converter is needed to convert the alternating current to direct current.

Power supplies 413, 433, 451 and 481 are used to provide electricity to loads 406, 426a, 426b, 446, and 466 respectively. As loads 406, 426a, 426b, 446, and 466 can be electric vehicles, lights, battery banks, home appliances, and any other electronics, the administrator or user of power controllers 401, 421, 441 and 461 needs to decide to use either alternating current or direct current based on the type of loads 406, 426a, 426b, 446, and 466. Grounds 414, 434, 452 and 482 provide a return path for powers 413, 433, 453 and 483. The purpose of having two powers for each of power controllers 401, 421, 441 and 461 is because the electricity provided to the processing module and load may require different voltage and current type. It is possible that a single power can be used to provide electricity to both the processing module and load if there is a suitable circuitry, such as a transformer, converting voltage and current between the processing module and the load.

Figure 4A:
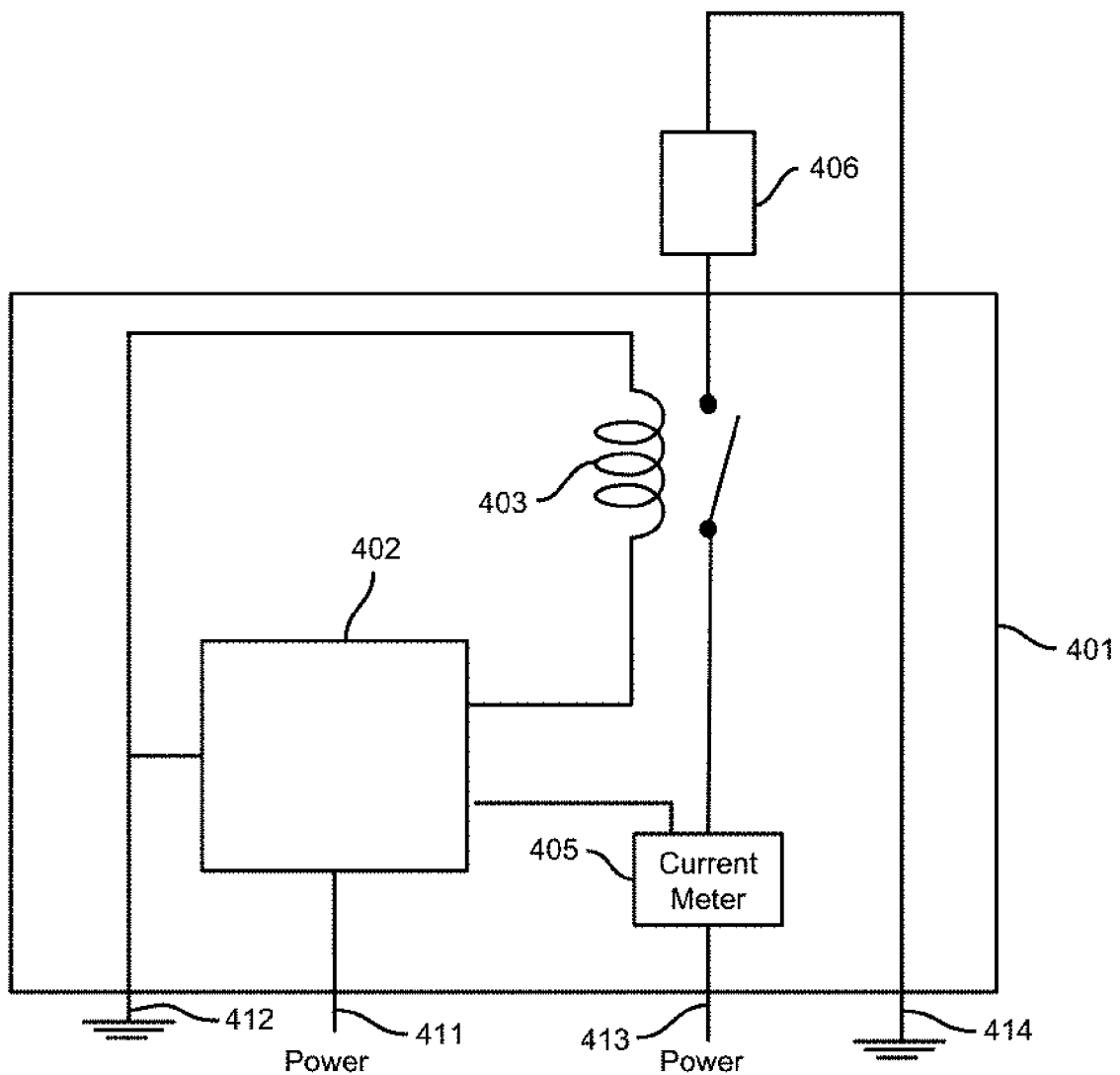
FIG. 4A is a circuit diagram illustration of implementing a power controller in one circuitry examples of the present invention.
Figure 4B:
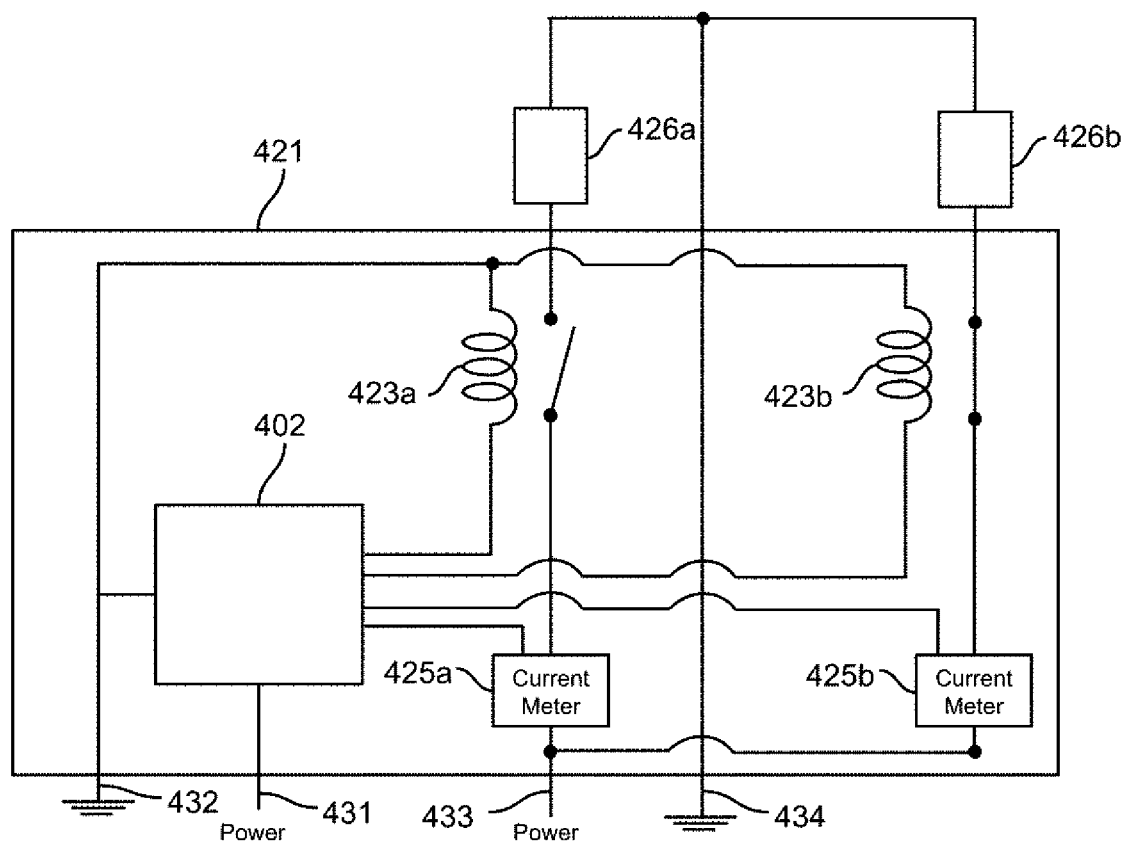
FIG. 4B is a circuit diagram illustration of implementing a power controller in another circuitry example of the present invention.
Figure 4C:
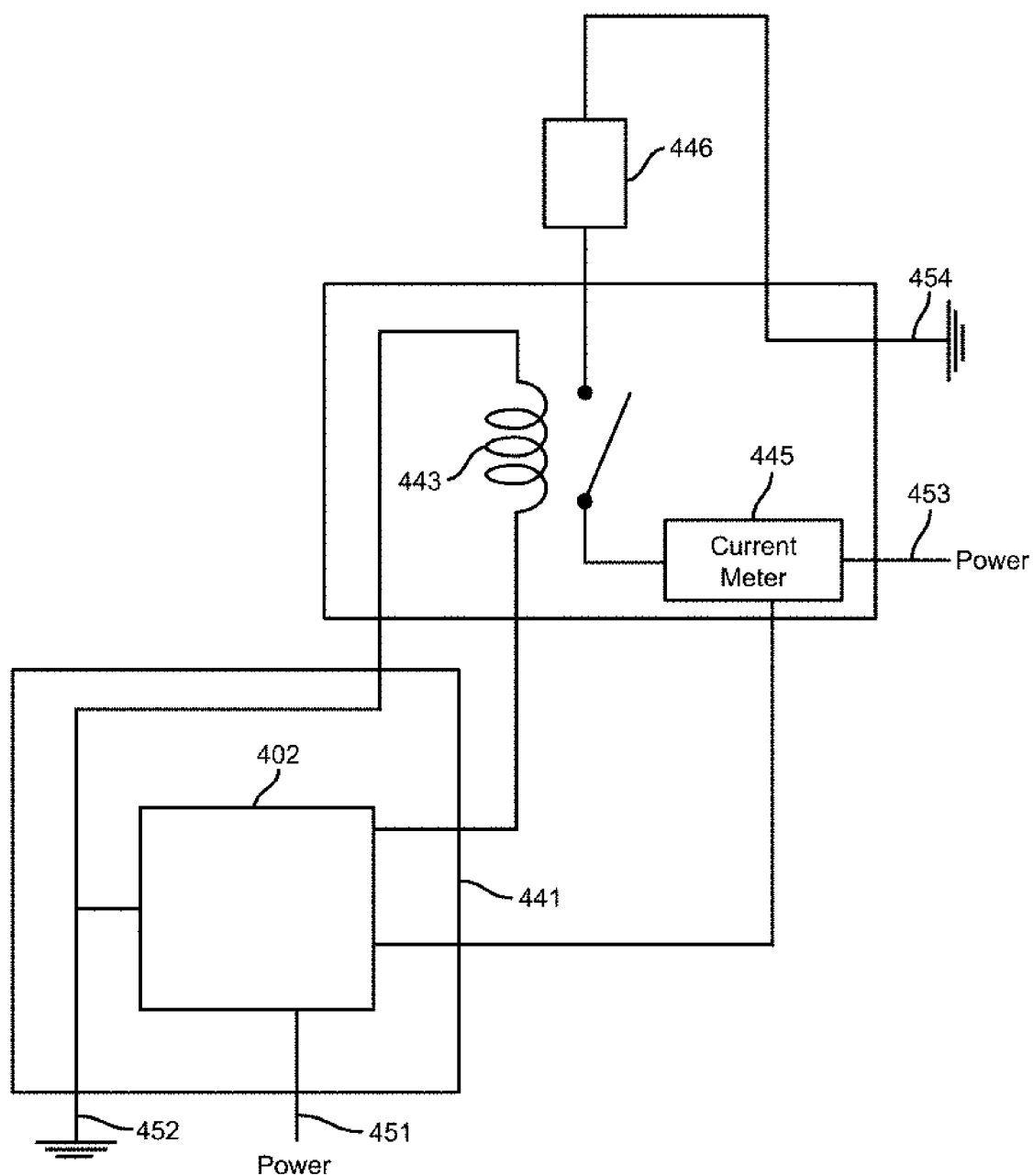
FIG. 4C is a circuit diagram illustration of implementing a power controller in another circuitry example of the present invention.
Figure 4D:
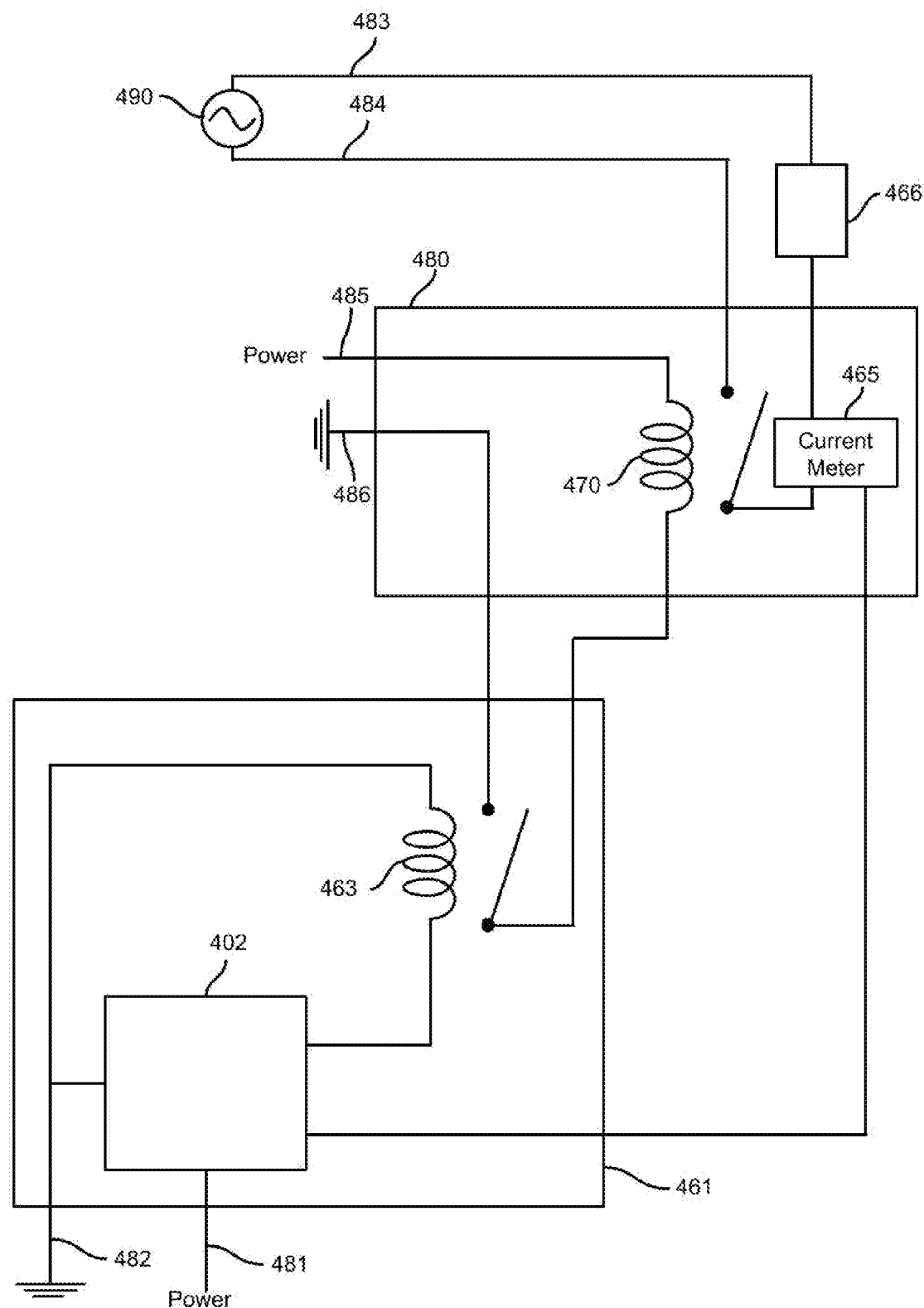
FIG. 4D is a circuit diagram illustration of implementing a power controller in another circuitry example of the present invention.

Ammeters 405, 425a, 425b, 445 and 465 are used to measure the amount of current supplied to loads 406, 426a, 426b, 446 and 466 respectively. When relays 403, 423a, 423b, 443 and 470 are enabled, their respective loads 406, 426a, 426b, 446 and 466 will receive electricity from power supplies 413, 433, 453, and 483 respectively. Relays 403, 423a, 423b and 443 are controlled by respective processing units of respective processing modules 402. Relay 470 is controlled by relay 463, which is controlled by the processing unit of processing module 402 of power controller 461. When relay 463 is enabled, a closed loop will be formed from power 485 via relay 470, relay 463 and ground 486 and cause relay 470 to be enabled. Power 485 can be the same or different from power 483. Depending on the relay used for relay 470, a transformer may be required if power 483 is used instead of power 485 as the voltage and current type requirements of relay 470 may be different from load 466. The benefits of having two relays as illustrated in FIG. 4D is to allow better safety protection.

One of the differences among power controllers 401, 421, 441 and 461 is the location of the relay and ammeter. The present invention does not limit the location of the relay and ammeter. The relay and ammeter can be housed in the same enclosure of processing module 402 as illustrated in FIG. 4A-4B or in different apparatuses as illustrated in FIG. 4C-4D. In FIG. 4C, when relay 443 is enabled, a closed loop will be formed from power 453 via relay 443, ammeter 445 and ground 454 and electric current flows through load 446. In one example, it is preferred that the processing module, relay and ammeter are housed in the same water-proof enclosure when the enclosure is placed outdoor for preventing water leakage and reducing maintenance cost.

In the embodiments of FIG. 4B, processing module 402 is capable of controlling one or more relays, same as the embodiments in FIGS. 1A, 1B and 2A.

Figure 4E:
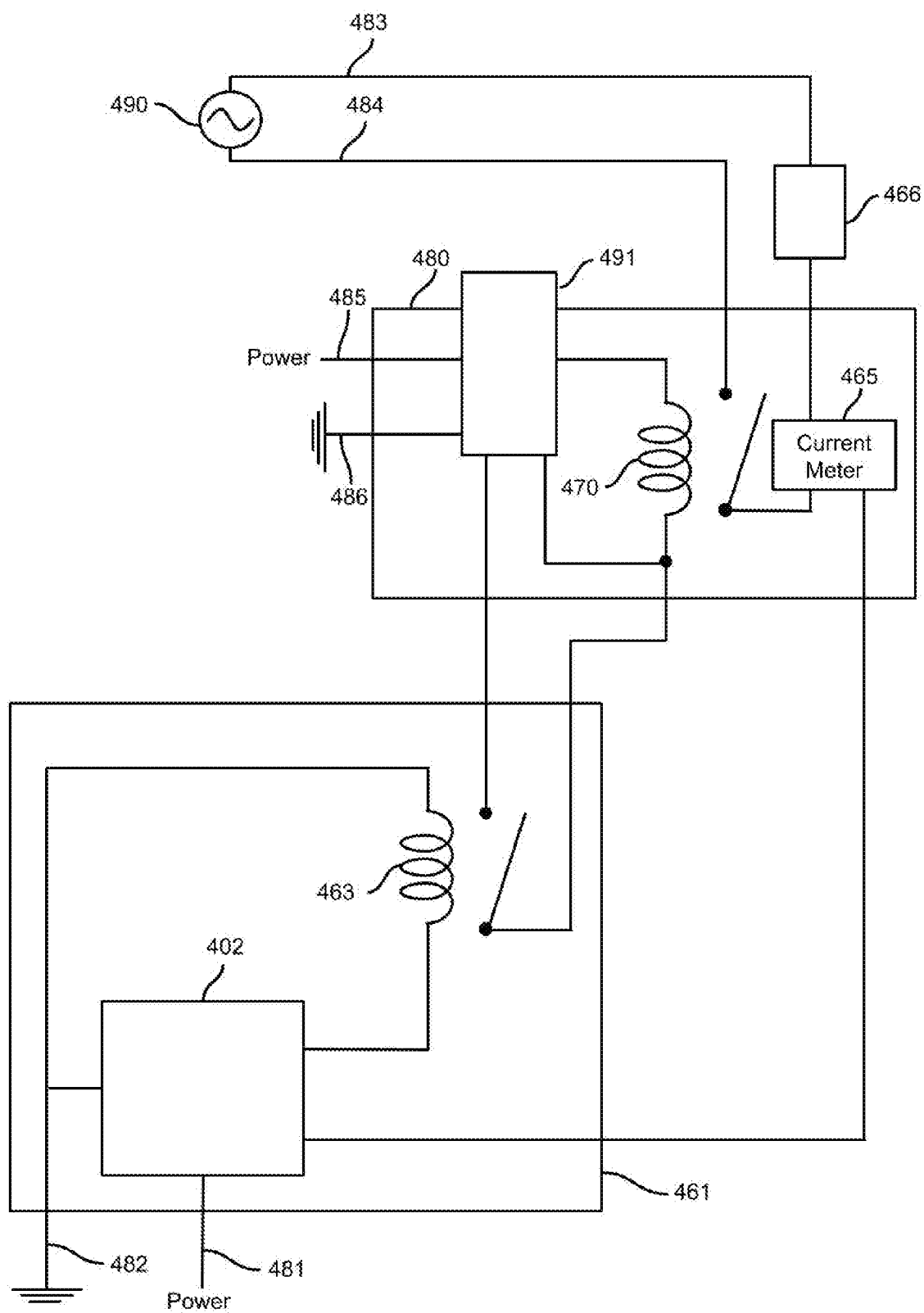
FIG. 4E is a circuit diagram illustrating one variant for providing additional safety and flexibility when providing electricity to load in one of the embodiments of the present invention.

FIG. 4E illustrates a variant for enclosure 480. Enclosure 480 has switch 491 for providing additional safety and flexibility when providing electricity to load 466. Switch 491 has three states. The first state does not interfere with the control from relay 463. The second state will form a close loop to enable relay 470 regardless when relay 463 is enabled or not. This second state allows load 466 to receive electricity regardless of the decision made by the processing unit of power controller 461. This is desirable in case power controller 461 is out of order and load 466 needs electricity urgently. The third state will result in an open circuit to disable relay 470 regardless if relay 463 is enabled or not. This third state cuts off the electricity provided to load 466 regardless of the decision made by the processing unit of power controller 461. This is desirable in case load 466 suddenly draws too much electricity, or if there is a fire or a hazard and electricity needs to be disconnected manually and/or mechanically. It is preferred that switch 491 is accessible on one side of enclosure 480 to allow easy access.

In one variant, using the processes illustrated in FIG. 6C, relay 463 is enabled even though load 466 is not scheduled to provide a large amount of current to a load. A small current provided by power supply 490 allows load 466 to be operable. For example, load 466 is a non-scheduled electric vehicle charger. When the amount of current measured by ammeter 465a is not more than the expected amount, relay 463 is enabled. When the amount of current measured by ammeter 465a is more than the expected current, relay 463 will be disabled. This allows the non-scheduled electric vehicle charger to receive electricity even when there no vehicle being charged for operations other than charging an electric vehicle.

Figure 5A:
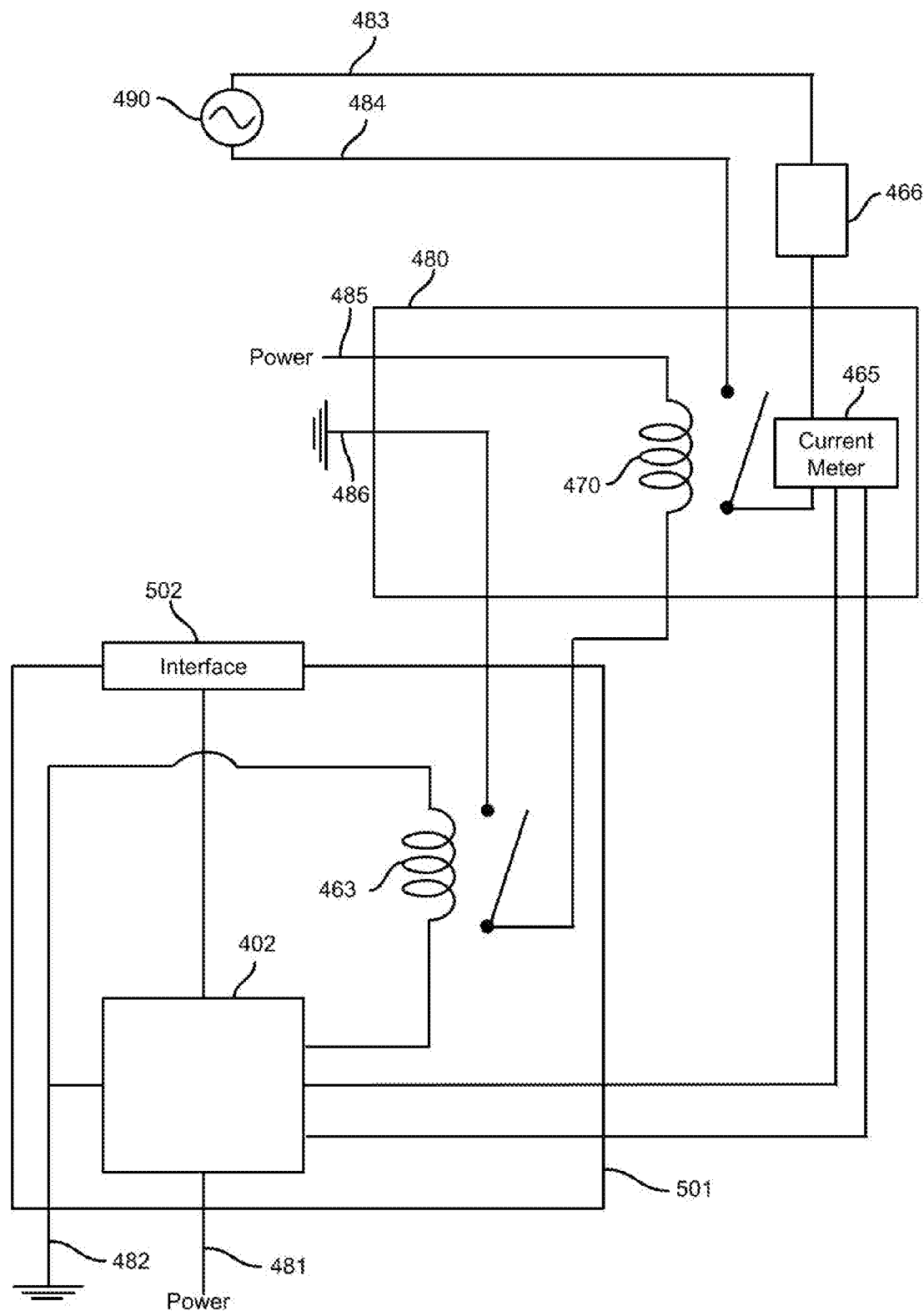
FIG. 5A is a circuit diagram illustrating one variant of power controller in one of the embodiments of the present invention.

FIG. 5A illustrates one of the embodiments of the present invention. Power controller 501 is a variant of power controller 461 of FIG. 4D. Interface 502 is connected to processing module 402 directly or through a bus. Interface 502 can be connected to one or more devices through wires or wirelessly for many operations, including authentication, data exchange, environment monitoring, image capturing, video capturing, audio capturing, voice communications, video communication and security. There is also no limitation that there is only one interface per power controller. For example, power controller 501 may have a plurality of Interfaces 502, such that one interface is for communicating with a mobile phone through Bluetooth and one interface is communicating with a temperature sensor through RS-232. There is also no limitation that interface 502 is only for a power controller with separate enclosures or two relays. Other power controllers discussed in the present invention can also have one or more interfaces for connecting to one or more devices.

Figure 5B:
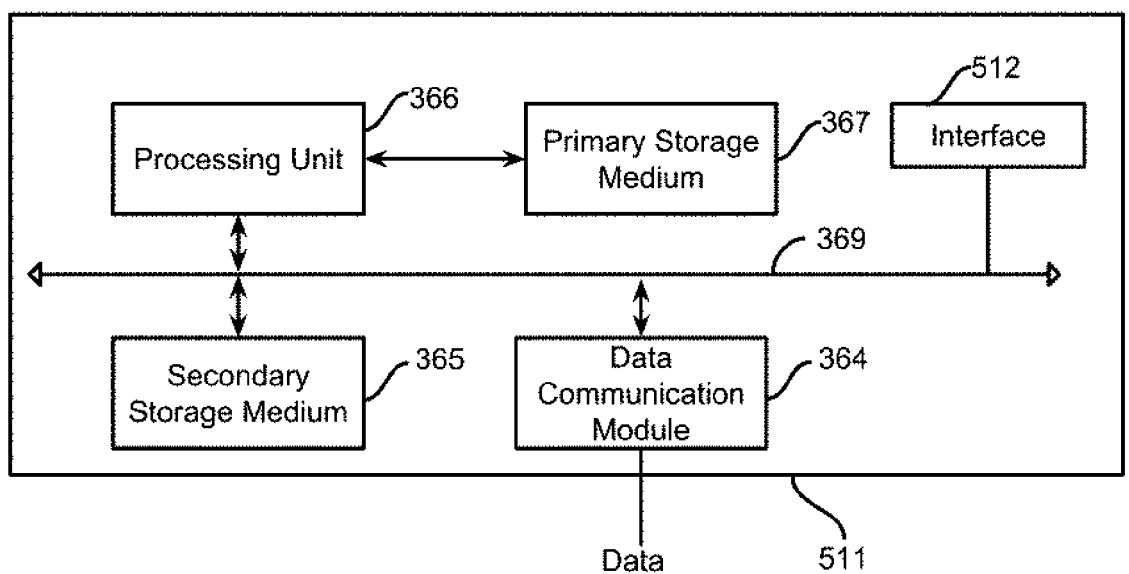
FIG. 5B is a block diagram illustrating one variant of power controller server in one of the embodiments of the present invention.

FIG. 5B illustrates one of the embodiments of the present invention. PCS 511 is a variant of PCS 310 of FIG. 3A and FIG. 3D. Interface 512 is connected to processing unit 366 directly or through data bus 369. Interface 512 provides functions and serve purposes similar to Interface 502 for connecting to one or more devices wired or wirelessly. There is also no limitation that PCS 511 can only have one Interface 512.

In one example, using the processes illustrated in FIG. 6A, the device connected to Interface 502 or Interface 512 is a reader that can read an access card or a mobile device's electromagnetic emission, including Radio-frequency identification (RFID) technology, Bluetooth technology and Near Field Communication (NFC) technology. For illustration purpose, when a user tries to provide electricity to load 466, the user needs to put his access card, RFID, or mobile device close to the reader connected to Interface 502. When the reader reads information from the user's access card, RFID, or mobile device, the identity information in the access card, RFID, or mobile device is passed to the processing unit of power controller 501. At step 602, processing unit determines whether the user has reserved a current time slot for receiving electricity for load 466. If the user has reserved a current time slot, then processing unit will determine if the total amount of current being drawn is below the first threshold at step 606. If the total amount of current being drawn is below the first threshold, then step 608 will be performed. Therefore, the processing unit, according to the scheduler server, determines whether to enable relay 463 to schedule the electric vehicle charger respectively and provide electricity to load 466 based on the identity information, current time slot, and total amount of current being drawn. As a result, in this example, step 602 has been modified to include one more condition that the authentication server authenticates the identity of a user through interface 502.

In one variant, regardless whether the user has reserved a time slot, as long as the processing unit of the power controller with instructions from the authentication server (i) is able to authenticate the user based on the user's access card, RFID, or mobile device, and (ii) the total amount of current being drawn is below the first threshold, then step 608 will be performed. This provides flexibility in case the user needs to have electricity be provided to load 466 urgently. For example, the user's electric vehicle is running out of battery and needs to be charged urgently through an electric vehicle charger, which is load 466.

In one variant, in the case of the embodiment of FIG. 5B, the user needs to put his access card, RFID, or mobile device close to the reader connected to Interface 512. The user may also need to choose the one of load 302 as illustrated in FIG. 3A for receiving electricity after the electric vehicle has been authenticated and scheduled from the authentication server and scheduler server respectively. For example, PCS 511 is located outside of the management office of a car park, a user who needs electricity to be provided to his parking space will swipe his mobile phone, which is enabled with NFC, to a reader, which is connected to Interface 512, to authenticate and authorize the provision of electricity. If the total amount of current being drawn is below the first threshold, then step 608 will be performed. The user may be required to input the identity of his parking space or electric vehicle charger, such that PCS 511 is able to identify the power controller to communicate with to enable the corresponding relay of the scheduled electric vehicle charger to provide electricity to the corresponding load. In one variant, the user is required to park his electric vehicle at his designated parking space; therefore PCS has advanced information about the identity of the parking space according to a database storing the relevant identity and parking space pairing information. The user will then not be required to input the identity of his parking space or electric vehicle charger. In one variant, the parking space or electric vehicle charger information is entered by an administrator of PCS 511.

In one variant, an imaging device, such as a camera or video camera, is connected to interface 502 or 512. The imaging device is capable of capturing an image or a video of the license plate number of an electric vehicle parked in the parking space or charged by an electric vehicle charger for authentication purpose. If the total amount of current being drawn is below the first threshold, the license plate number matches an entry of the database, and if there is an available current time slot, the processing unit of power controller or PCS will enable the corresponding relay to provide electricity to the corresponding electric vehicle charger in step 608. Otherwise, no electricity is provided to the electric vehicle charger. In one more detailed example, an alert will be sent to the owner of the parking space or the car park management office for further action, such as to move the electric vehicle away. In one variant, instead of capturing the license plate number, the imaging device can be used to capture the user's face or information of the access card or mobile device for performing the same authentication purpose.

In one variant, the reader is capable of reading a tag placed in or mounted on an electric vehicle wirelessly. By reading the tag, processing unit of the power controller or PCS can perform the authentication process to determine whether the electric vehicle should be charged at a particular electric vehicle charger at the particular time slot on the condition that the total amount of current being drawn is below the first threshold. If the electric vehicle should be charged, the relay corresponding to the electric vehicle charger will be enabled.

Rows C and D of time scheduler 800 can be used to illustrate the importance to authenticate a user. For illustration purpose, as for Monday, users "Joe325" and "martin101" both reserve the same time slot 14:00-15:00 for charging their electric vehicle. If there is enough electricity to be supplied but the only available electric vehicle charger is the one located at load 102*a*, user "martin101" should have higher priority than user "Joe325" for using the electric vehicle charger because the priority of user "Joe325" is the lowest. For illustration purpose, load 466 is the same as load 102*a*. If user "Joe325" has authenticated himself with an access card through a reader, which is connected to Interface 502, and tries to charge his electric vehicle through the electric vehicle charger at load 466, no electricity should be provided as power controller 501 does not enable relay 463. If user "Joe325" continues to occupy the electric vehicle charger located at load 102*a*, an administrator can be alerted for further action, including towing the electric vehicle of user "Joe325" away. This ensures that user "martin101" has higher priority to charge his electric vehicle over user "Joe325". In one variant, if user "martin101" has not yet authenticated himself before 14:15, he will lose his priority and user "Joe325" can start using load 102*a*. There is no limit that fifteen minutes is the deadline before losing priority. Other time periods, such as five minutes or 30 minutes, may be used to determine when user "martin101" will lose his priority.

In one variant, interface 502 or 512 is connected to one or more sensors, including temperature sensors, humidity sensors, smoke detector and fire detector. As the amount of electricity provide to the load can be large and can cause hazard, sensors can be used to monitor the environment for preventing hazards and/or detecting hazards. For example, when temperature becomes high, say about 70 degree Celsius, the risk of fire hazard become large, especially when the load and sensor are placed in the same enclosure or close together. A high temperature usually means poor heat dissipation and/or large electricity consumption. Processing unit of power controller or PCS may determine whether to disable or not to enable the corresponding relay to stop providing electricity to the load regardless the time schedule and if the total amount of current being drawn is below the first threshold. Therefore at steps 604 and 606, readings from the sensors are used in addition for considering whether to disable any relay and whether to enable an additional relay. In another example, when a fire or smoke is detected by a detector, the information is sent through interface 502 or 512 to processing unit, and then through data communication module to alert the management and fire department. Furthermore, Electricity supply will be stopped to one or more loads, close to the location where fire or smoke is detected, by the processing units of corresponding power controllers and PCS.

Figure 9A:
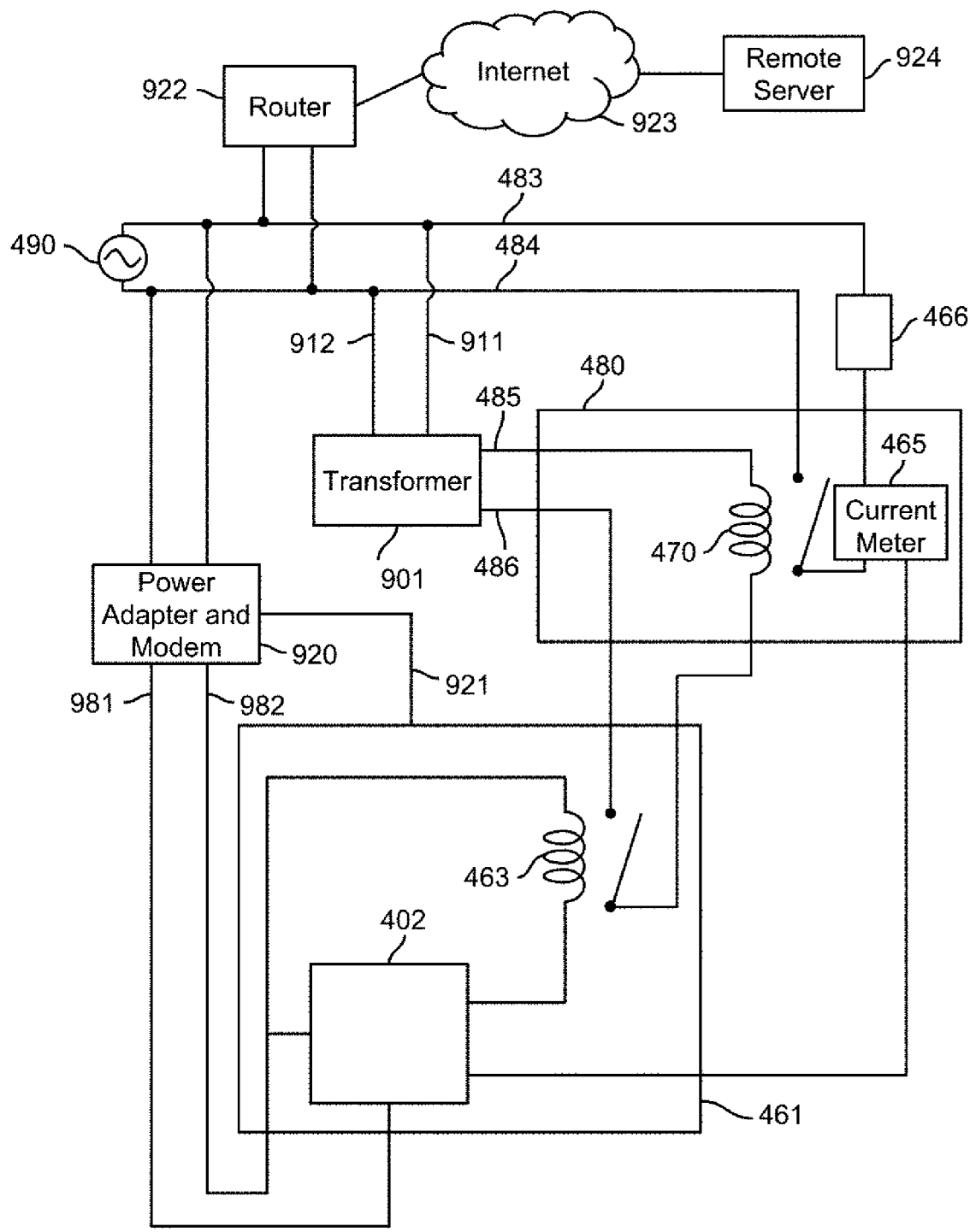
FIG. 9A is a circuit diagram illustrating one of the embodiments according to the present invention that is based on the embodiment illustrated in FIG. 4D.
Figure 10A:
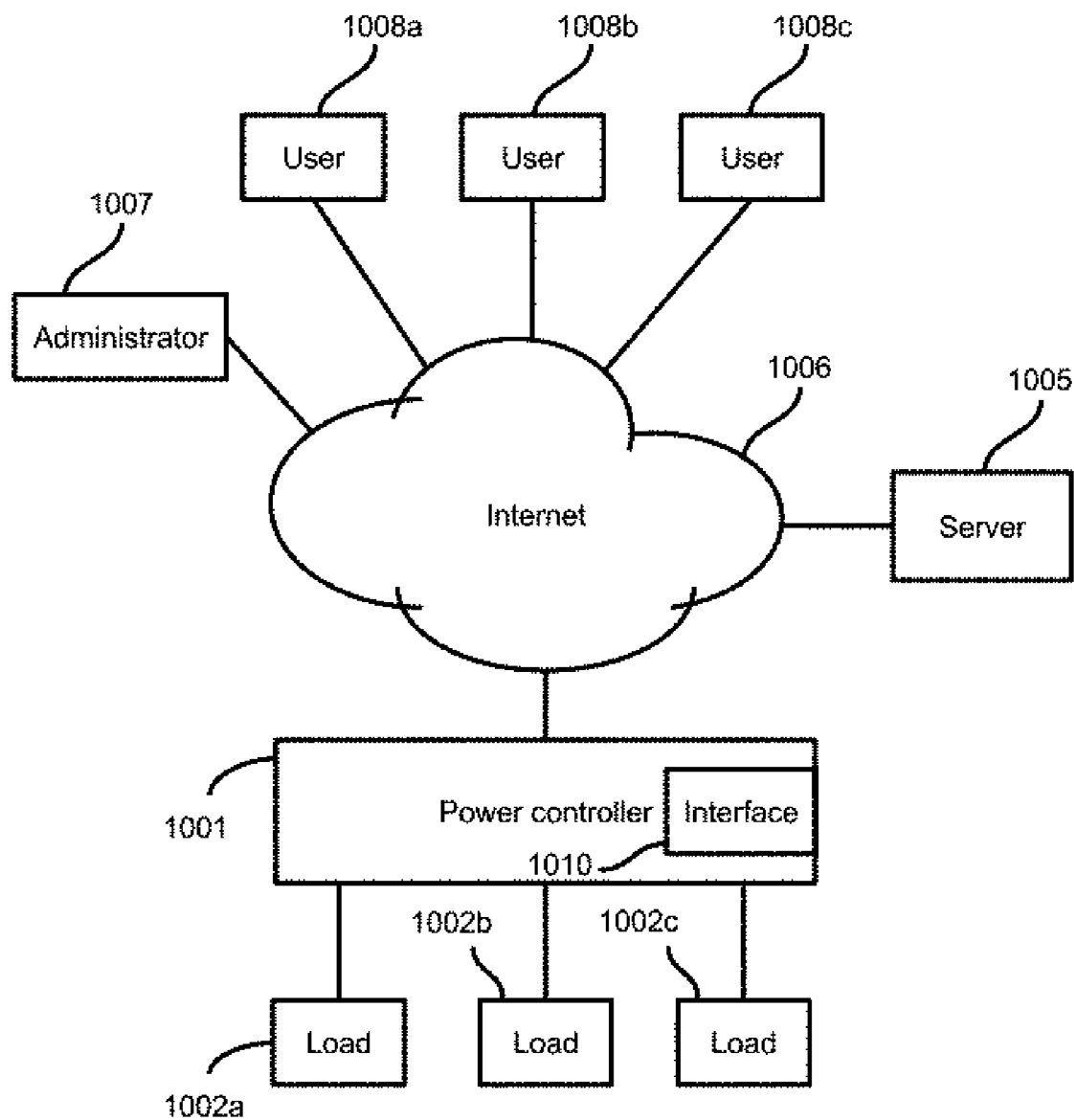
FIG. 10A is a block diagram illustrating how a user can make reservations for using one of the loads at server through the Internet in one of the embodiments of the present invention.

FIG. 9A illustrates one of the embodiments according to the present invention that is based on the embodiment illustrated in FIG. 4D. Enclosure 480 receives electricity from power supply 490 through transformer 901 through wires 485 and 486. The specification of transformer 901 depends on the requirement of relay 470. For example, if relay 470 needs a 20V AC power input, then transformer 901 should be able to convert voltage from power supply 490 to 20V AC for relay 470 uses. If relay 470 needs a 5V DC power input, then transformer 901 should be able to convert voltage to 5V DC for relay 470 uses. The benefit of having transformer 901 is to rely on one common power source for both relay 470 and load 466. Power adapter 920 also converts voltage from power supply 490 to the required voltage and current type for power controller 461 uses. Further, Power adapter 920 is able to connect power controller 461 to router 922 through normal electrical wires by using communication technologies, such as HomePlug. Wires 981 and 982 are for providing electricity to power controller 461. Connection 921 is for data communication, such as Ethernet and WLAN. Therefore data communication module of processing module 402 is able to send and receive data to and from remote server 924 via the Internet 923 through Power adapter 920 and router 922. Remote server 924 is similar to server 1005 as illustrated in FIG. 10A and also comprises a scheduler server and an authentication server. The benefits of using technologies, such as Home-Plug, reduce the need to build a separate wired or wireless data communication infrastructure for controlling relay 470 and reading current usage from ammeter 465*a*.

Figure 9B:
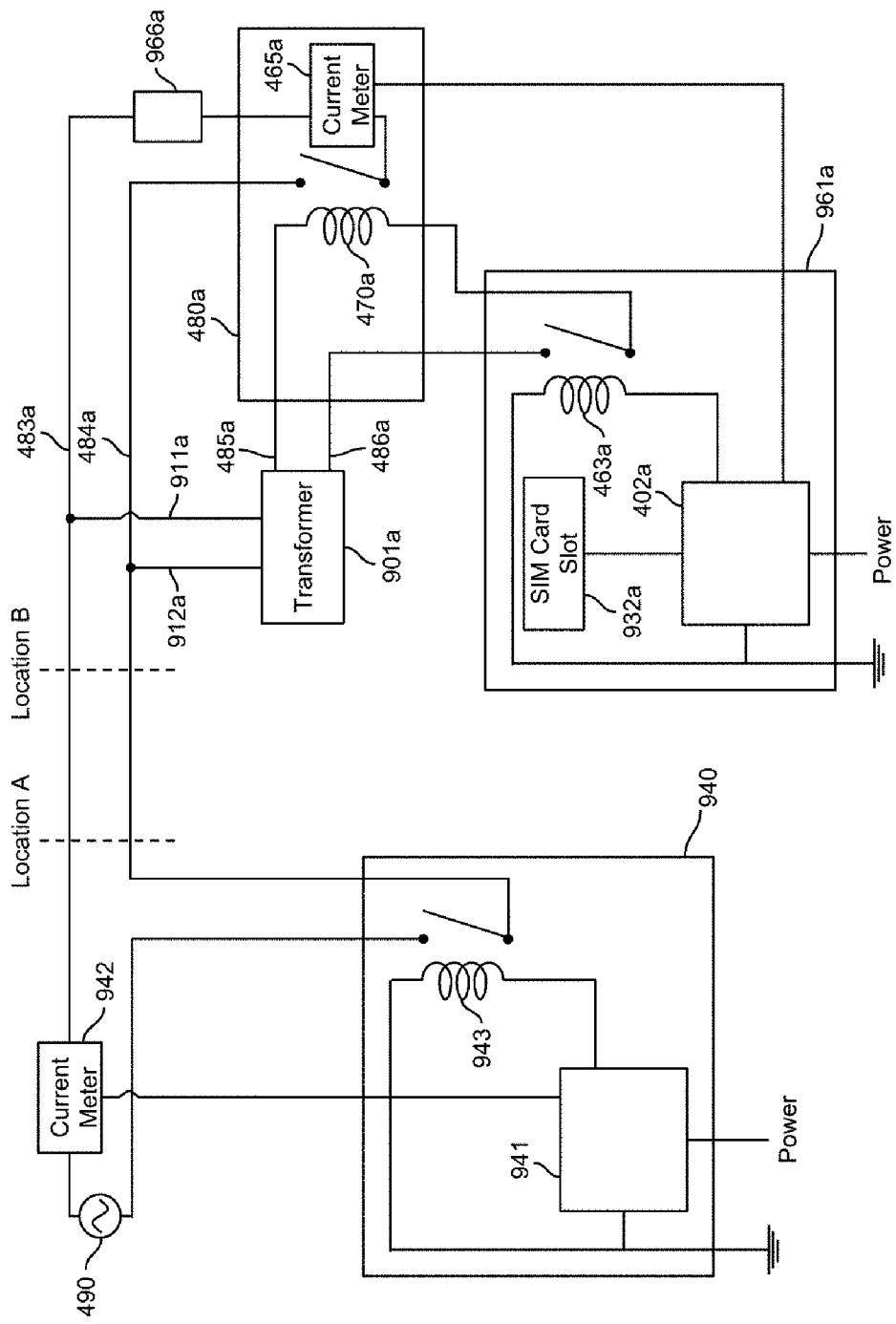
FIG. 9B is another circuit diagram illustrating one of the embodiments according to the present invention that is based on the embodiment illustrated in FIG. 4D.

FIG. 9B illustrates one of the embodiments according to the present invention that is based on the embodiment illustrated in FIG. 4D. Similar to the embodiment illustrated in FIG. 9A, enclosure 480*a* receives electricity from power supply 490 through transformer 901*a* through wires 485*a* and 486*a*. Power controller 961*a* is similar to power controller 461 but is capable of transmitting and receiving data through mobile communication technology, such as 2G, 3G, 4G and LTE. SIM card slot 932*a* is capable of housing a SIM card for mobile communication. One of the benefits of using mobile communication technology is it allows flexible deployment. For example, an electric vehicle charger can be installed in remote areas that may be difficult to be connected with wired communication technology. Using mobile communication technology allows the electric vehicle charger to be located almost anywhere as long as there is an adequate supply of electricity and mobile communication coverage.

The main purpose of having power supply enabler 940 is to enable and disable the supply of power from location A to location B. The distance between power supply 490, which is at the left of location A, and location B can be long and subjected to hazardous conditions, or known for theft of electricity. Therefore, it is desirable that no electricity should be provided to the right of location A and load 966*a* until there is an instruction from power supply enabler 940 to do so. This is especially important for electric vehicle chargers that are usually connected to larger supply of electricity and has easier access.

The design of power supply enabler 940 is similar to power controller 461*a*. Processing module 941 enables or disables relay 943 according to instructions received through a data communication module in processing module 941. When relays 943, 463*a* and 470*a* are enabled, load 966*a* can then start receiving electricity. In one variant, processing module 941 may enable relay 943 even relay 463*a* and relay 470*a* may not be enabled, in order to provide adequate electricity to power controller 961*a* or the electric vehicle charger housing power controller 961*a* for other operations. However this may cause hazard if there is an electricity leakage between location A and location B, or an opportunity for theft of electricity between location A and location B Ammeter 942 measures the amount of current supplied by power supply 490. Based on the amount of current supplied, processing module 941 is capable of detecting if the current being drawn is higher than the designated amount. If a thief tries to steal electricity from the wires between location A and the location B, the amount of current drawn will be more than the amount being drawn by power controller 961*a* and load 966*a* are allowed to drawn. For example, when there is no load, the amount of current drawn by power controller 961*a* and transformer 901*a* may be up to 0.5 A. Including the power lost due to resistance between location A and location B, the total amount of current being drawn when there is no load could be up to 1.0 A. When relay 463*a* is not enabled by processing module 402*a* but the current being drawn from power supply 490 measured by ammeter 942 is about 5 A, it is very likely either there is leakage or electricity is being stolen. Therefore, processing module 941 may then determine whether to disable relay 943 and not to provide electricity to power controller 961*a* and load 966*a*. Similarly, when processing module 402*a* have enabled relay 463*a* for providing electricity to load 966*a*, for illustration purpose, the maximum amount of current allowed is 50 A. When ammeter 942 has detected the amount of current is above 50 A, processing module 941 may then determine whether to disable relay 943 for precaution. A technician or an engineer can then be dispatched to determine the cause of additional current being drawn. This may help to detect leakage or to stop stealing of electricity. If it is determined that the maximum amount of current allowed should be adjusted to a higher value, the administrator may then adjust value in an instruction to processing module 941.

Figure 9C:
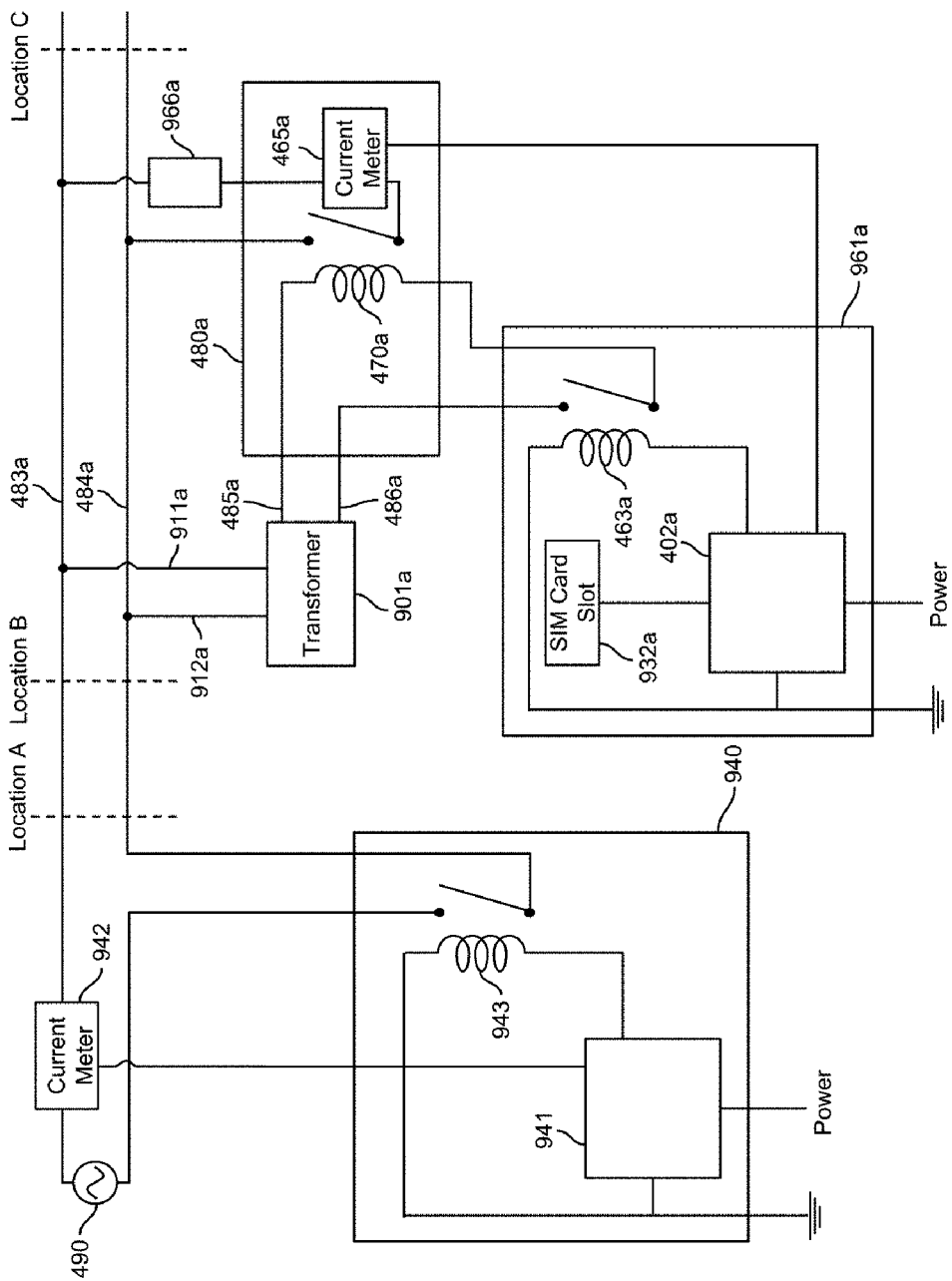
FIG. 9C is a part of another circuit diagram illustrating one of the embodiments according to the present invention.
Figure 9D:
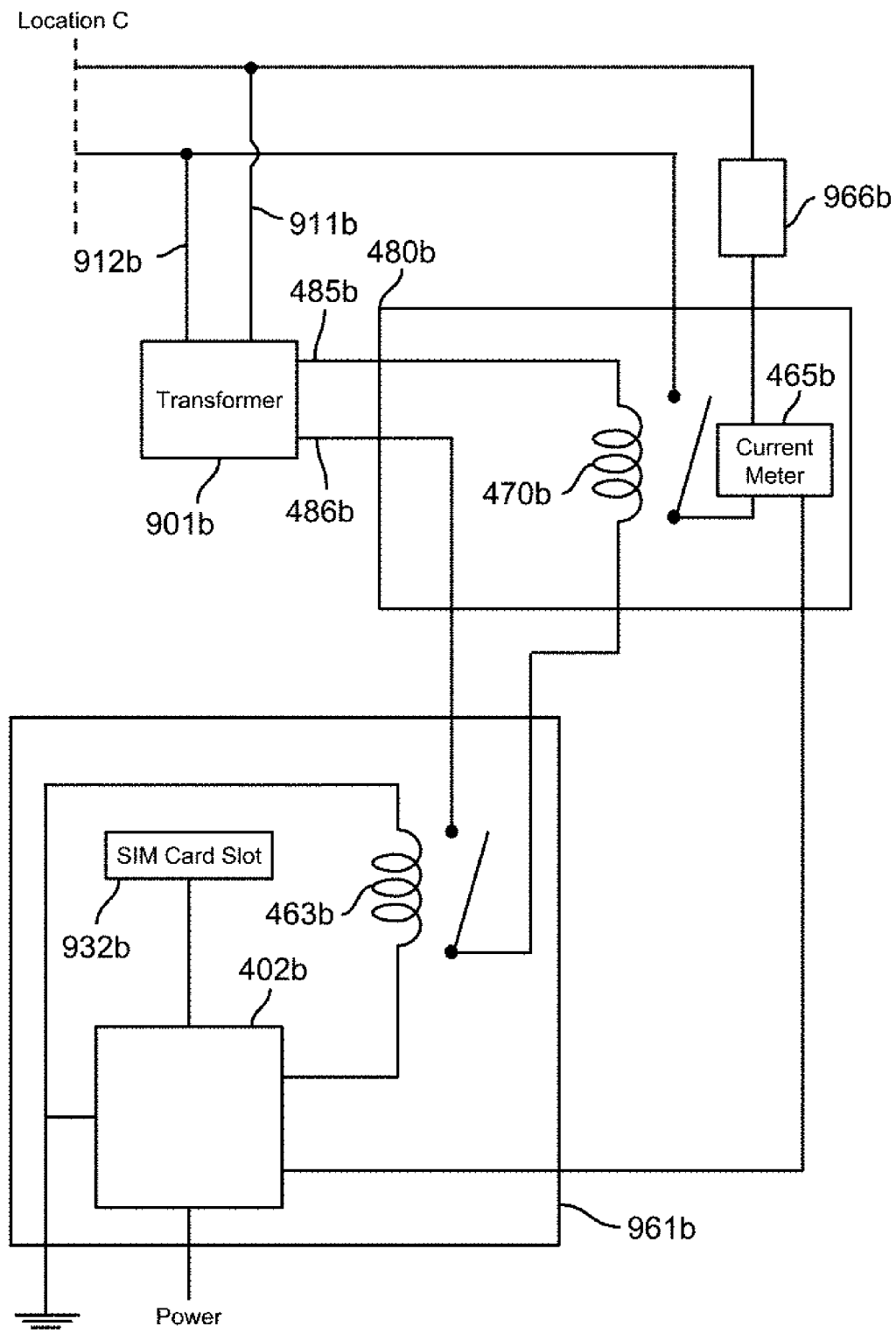
FIG. 9D is another part of the circuit diagram illustrated in FIG. 9C.

There is no limitation that only one power controller can be connected. More power controllers, such as power controller 961*b* can also be connected to the right of location C in FIG. 9D. Processing module 402*b* as illustrated in FIG. 9D is the same as processing module 402*a* as illustrated in FIG. 9C. Also powers 483*a* and 484*a* as illustrated in FIG. 9C are same as powers 483 and 484 as illustrated in FIG. 9A respectively.

In one variant, the amount of current that power supply 490 can be supplied with the amount of current received by load 966*a* plus a threshold. The amount of current received by load 966*a* is measured by ammeter 465*a*. Processing module 402 retrieves the current measurement from ammeter 465*a* then sends the current measurement to power supply enabler 940. As processing module 941 is able to determine how much current is supplied by power supply 490 through ammeter 942, processing module 941 is able to determine the difference between the current supplied and the current received by load 966*a*. If the difference is larger than the threshold, it may indicate that there is electricity being stolen or leaked and processing module 941 may send a message to the administrator for corrective and preventive actions. Processing module 941 may also decide to stop providing electricity to load 966*a* in order to stop electricity being stolen or prevent leakage. In such case, a message is sent to power controller 961*a* to instruct power controller 961*a* to disable relay 463*a*. In one variant, instead of sending the current measurement reading directly from power controller 961*a* to power supply 490, a remote server can be used to relay the current measurement reading from power controller 961*a* to power supply 490. The remote server can also be used to relay the instruction from power supply 490 to power controller 961*a*. This may simplify the design of both power controllers 961*a* to power supply 490. The communications among power controller 961*a*, power supply 490 and the remote server can be performed by data communication modules at power controller 961*a*, power supply 490 and the remote server respectively.

In one variant, when the difference is larger than the threshold, the instruction to disable relay 463*a* is not sent immediately. As load 966*a* is still receiving electricity, a sudden discontinuation of electricity may cause damage to the apparatus connected at load 966*a*. It may be more desirable to disable relay 463*a* after the user of load 966*a* is being alerted first or to dispatch investigators/engineers to investigate the reason of the large difference. Therefore, a message is sent to power controller 961*a* to alert its administrator or user about the approaching electricity connection.

In one example, for illustration purpose, power controller 961*a* is equipped with a NFC reader. When a user swipes his NFC to authenticate himself and authorize a payment for using an electric vehicle charger connected at load 966*a*, an instruction is sent by power controller 961*a* through the data communication module to power supply enabler 940 while enabling relay 463*a*. There is no limitation that the instructions must be sent by power controller 961*a*. The instruction, for example, can be sent by a PCS after the PCS receives a message from power controller 461 for successful authentication and payment approval. Then the instruction is sent by the PCS to power supply enabler 940.

A remote server can also be used to receive messages from and send messages to power supply enabler 940 and power controller 961*a*, such that power supply enabler 940 and power controller 961*a* do not directly communicate with each order. This may simplify the design of power supply enabler 940 and power controller 961*a* and also improve security. A PCS can be used as the remote server.

When the instruction is received by processing module 941, processing module 941 enables relay 943 and electricity becomes available to the right of location A. As relay 463*a* is already enabled, load 966*a* will start receiving electricity.

In one variant, an ammeter is used not only to monitor the amount of current being used by a load for keeping the total amount of current being drawn by all the loads within a threshold for safety purpose, but is also used to monitor the amount of current being used by the load for payment purpose. For example, when a load is an electric vehicle charger, electric vehicles may be parked at a parking space and be charged through the electric vehicle charger. The amount of electricity consumed by an electric vehicle can be determined based on the monitoring result of the ammeter. As those who are skilled in the art would appreciate that the amount of power consumed is voltage times current hour. For example, a user has authenticated himself and authorized a PCS to charge his electric vehicle through an electric vehicle charger for three hours of 30 A current with 220V. The power consumption will be three hours times 30A times 220V and results in 19.8 kWh. If each kWh costs the user about one dollar, the total cost is $19.8 and PCS will charge the user accordingly.

In another example, the cost for changing at different times may be different. For example, the charging price for 1 kWh between 9 am to 5 pm is two dollars while between 5 am to 8 pm is be two dollars and between 8 pm to 9 am is fifty cents. When an electric vehicle owner has charged 10 kWh from 4 pm to 5 pm, and another 10 kWh from 5 pm to 6 pm, the total cost to the owner will be 10 kWh times one dollar per kWh plus 10 kWh times two dollars per kWh. This illustrates one of the benefits of monitoring the current amount from the ammeters frequently or even continuously. The use of ammeter for payment purpose eliminates the need to use an electricity meter and results in lower total operational cost and manufacturing cost of power controller and/or PCS.

There is no limitation that an ammeter should be designed for DC or AC. It is preferred that the ammeter is capable of measuring both DC and AC current in order to be compatible with more electric vehicle chargers.

In one variant, ammeters are not required in the embodiments illustrated in FIGS. 1-5 and 9 if there is adequate current and electricity to supply all loads at the same time. The first threshold discussed in the process illustrated in FIG. 6 becomes insignificant as the risk of safety hazard due to overload has been reduced. Therefore, the needs of monitoring the total amount of current being drawn also diminish. However, if the operator of power controller, PCS or electric vehicle charging facility want to collect revenues based on the amount of electricity consumed, ammeters are also desired. In one variant, instead of using ammeters, electricity meters can be used for measuring the amount of electricity consumed by a user when his electric vehicle is being charged. For example, ammeters 465 and 230 can be replaced by electricity meters.

Figure 10B:
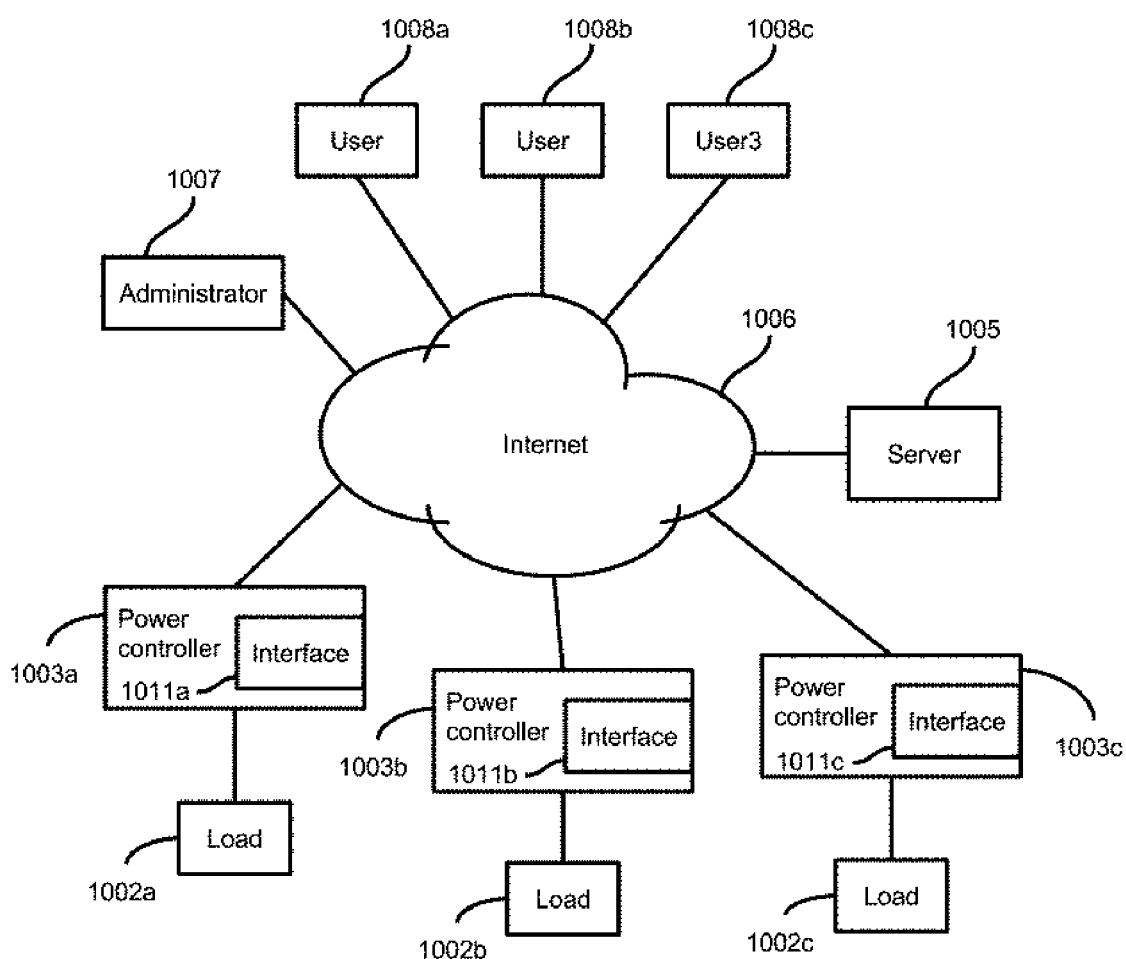
FIG. 10B is another block diagram illustrating how a user can make reservations for using one of loads at server through the Internet in one of the embodiments of the present invention.
Figure 10C:
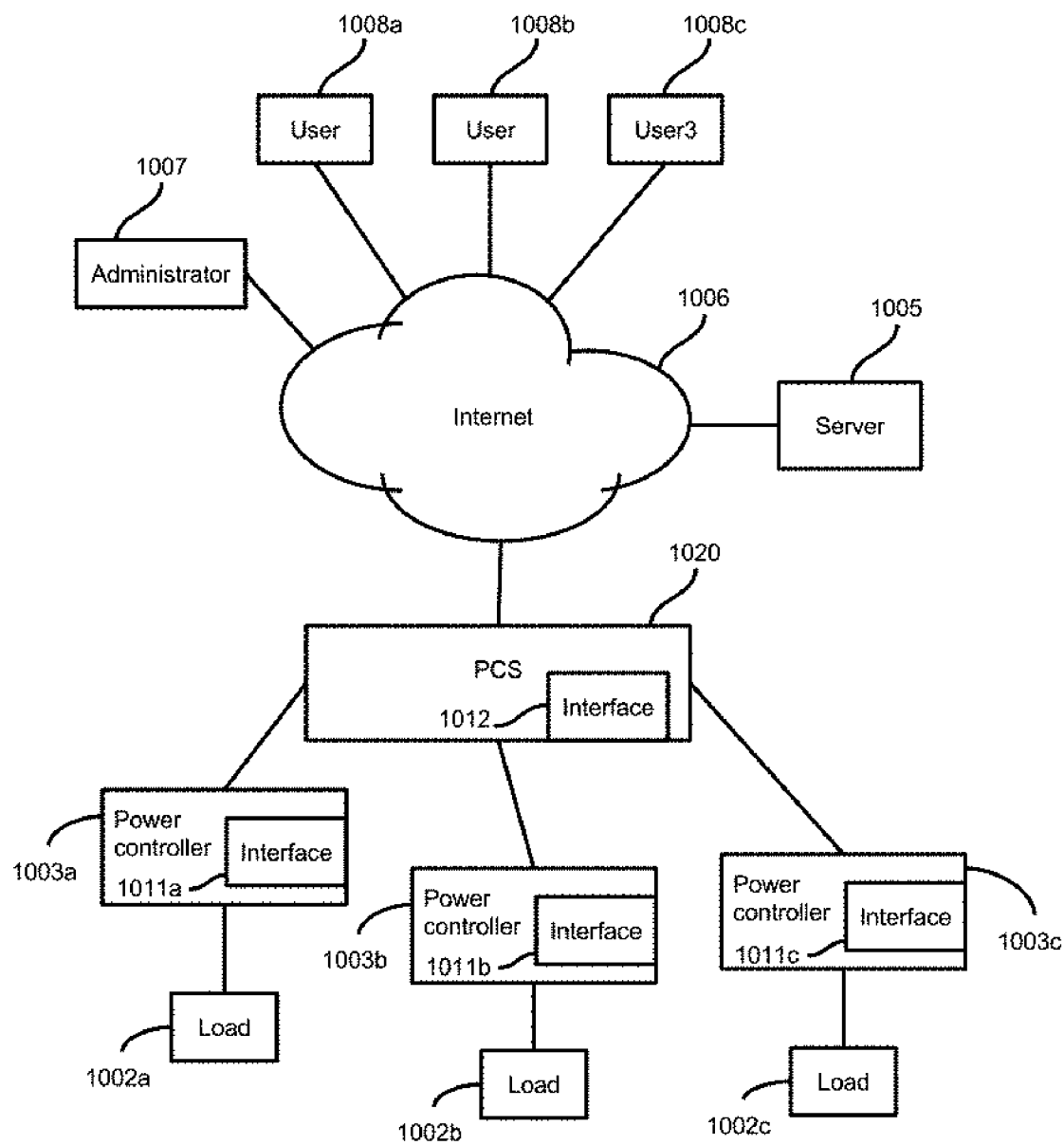
FIG. 10C is another block diagram illustrating how a user can make reservations for using one of loads at server through the Internet in one of the embodiments of the present invention.

FIG. 10A illustrates one of the embodiments according to the present invention. users 1008 can make reservations for using one of loads 1002 at server 1005 through the Internet 1006. In one variant, users 1008*a*, 1008*b* and 1008*c* can enter time period in time slots 804 by using user input interface. Administrator 1007 manages server 1005 and power controller 1001. Power controller 1001 connects to the Internet 1006 through its own data communication module. Power controller 1001 is connected to loads 1002*a*, 1002*b* and 1002*c*. Loads 1002*a*, 1002*b*, 1002*c* as illustrated in FIG. 10A, FIG. 10B and FIG. 10C are same as loads 102*a*-102*f* as illustrated in FIG. 1A. For each of loads 1002, there is a relay controlled by power controller 1001 for allowing or disallowing electricity to be supplied to the load. Interface 1010 performs the similar functions as interfaces 502 and 512 discussed earlier. Users 1008 can authenticate themselves and authorize payments when they are ready to use loads 1002 through a device connected to Interface 1010. For example, user 1008*a* may authenticate himself by placing his personal NFC device against a NFC reader, which is connected to Interface 1010. Further, Interface 1010 may connect to one or more sensors for monitoring the environments. Server 1005 may perform several functions, including communicating with car park users 1008 and administrator 1007, managing reservations, sending out alert messages, controlling one or more power controller 1001, managing billings and payments. There is no limitation on the architecture of server 1005. For example, server 1005 can be a computer server, laptop, desktop, a cloud server, a Smartphone or any other electronic device that is able to communicate to the Internet. When there is more than one power controller 1001 at different locations, such as different car parks across a city or country, users 1008 are able to make reservation with server 1005 for electric vehicle chargers connected to respective chargers at different locations.

FIG. 10B illustrates one of the embodiments according to the present invention. The embodiment illustrated in FIG. 10B is similar to the embodiment illustrated in FIG. 10A. Power controllers 1003 only control one load. Interfaces 1011 can be used for authentication for the use of respective load and for connecting to one or more sensors. Each of power controllers 1003 connects to the Internet 1006 individually through its own data communication module. This allows more flexibility over the embodiment illustrated in FIG. 10A. However, the administrator may need to spend more effort in managing the increased number of power controllers 1003. Furthermore, if power controllers 1003 connects to the Internet 1006 through mobile data, such 2G, 3G, 4G and LTE, the number of SIM cards required for power controllers 1003 is more than the number of SIM cards required for power controller 1001. This may result in increase of cost.

FIG. 10C illustrates one of the embodiments according to the present invention. The embodiment illustrated in FIG. 10C is similar to the embodiment illustrated in FIG. 10B. PCS 1020 is added in FIG. 10C. PCS 1020 connects to power controller 1003 directly or through a local area network (LAN), such as Wireless LAN. PCS 1020 performs the functions discussed in FIG. 3A and FIG. 3B in relation to PCS 310. Further PCS 1020 is capable of communicating to server 1005, users 1008 and administrator 1007 through the Internet 1006. In one example, PCS 1020 is equipped with a cellular data communication module that works in conjunction with a SIM card using 2G, 3G, 4G or LTE technology. This allows flexible deployment even in areas that are not very compatible with wired data connectivity. Power controller 1003 can also communicate with server 1005, users 1008 and administrator 1007 through PCS 1020. This reduces the need of using cellular data communication module for power controller 1003 and results in lower manufacturing cost. Interface 1012 can perform the same functions as interfaces 1011. Further, in one example, when a user has authenticated with PCS 1020 through a reader connected to Interface 1012; the user is not required to perform the authentication again at a respective power controller 1003.

In one example, when a user, such as user 1008*a*, performs an authentication or payment authorization, his identity and approval information are forwarded to server 1005. The authentication server in server 1005 is capable of verifying if the identity and approval information are authentic. The verification result is then sent back to respective PCS or power controller/s. Furthermore, usage records, such as electricity consumption monitored by power controller through respective ammeter and time of using a load, can be stored at server 1005 for analyzing and profiling. Additionally, server 1005 can communicate with a payment gateway to bill and charge the user for using the load and consuming electricity. In one variant, interfaces 1011*a*, 1011*b* and 1011*c* are network interfaces which are provided by power controllers 1003*a*, 1003*b* and 1003*c* respectively where the network interface can be an Ethernet interface, a frame relay interface, a fiber optic interface, a cable interface, a DSL interface, a token ring interface, a serial bus interface, a universal serial bus (USB) interface, Firewire interface, and Peripheral Component Interconnect (PCI) interface, etc.

Figure 11:
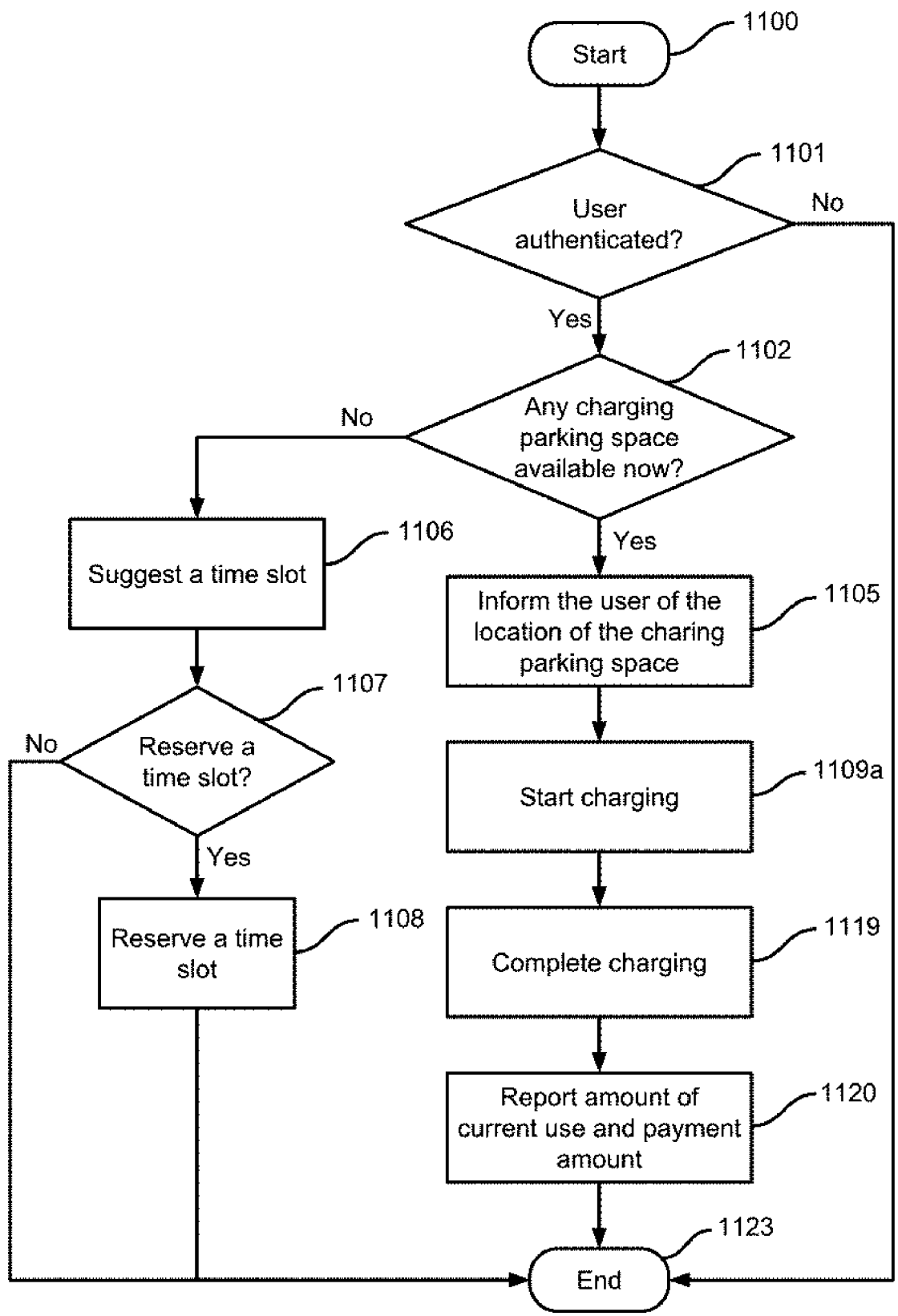
FIG. 11 is a flowchart illustrating a process performed by a server according to one of the embodiments of the present invention.
Figure 12:
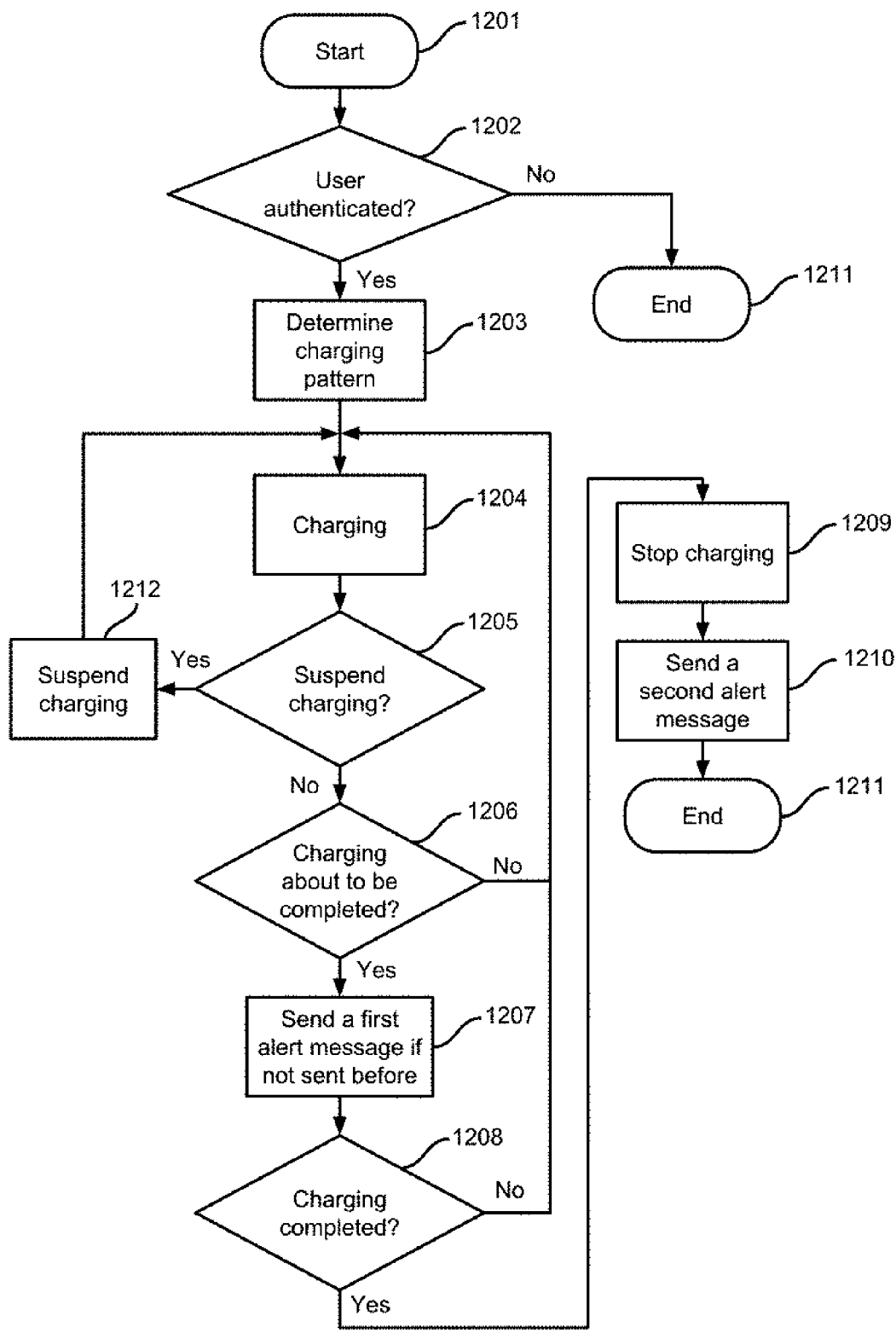
FIG. 12 is another flowchart illustrating a process performed by a server according to one of the embodiments of the present invention.

FIG. 11 illustrates a process performed by server 1005 according to one of the embodiments of the present invention for server 1005. The process illustrated in FIG. 11 is preferred to be used at a vehicle parking facility that has a plurality of electric vehicle chargers where electric vehicles can be charged while being parked. In one example, the vehicle parking facility may have all of its parking space equipped with electric vehicle chargers but not all electric vehicle chargers can be used at the same time due to electricity supply limitation. The number of electric vehicles which can be charged is dependent on the electricity capacity of the system. If there is not enough electricity capacity to allow all of the plurality of electric vehicle chargers to charge electric vehicles simultaneously, server 1005 will determine if there is enough electricity capacity to allow and schedule an electric vehicle charger to charge an electric vehicle of the user. In another example, the vehicle parking facility may have some but not all of its parking space equipped with electric vehicle chargers that a parked electric vehicle can be charged unless it is parked at the parking space equipped with an electric vehicle charger. As a result, a reservation system is desired to increase the efficiency of the use of electric vehicle chargers. When viewing in conjunction with FIG. 2A, the electric vehicle chargers are connected to loads 102 respectively or can correspond to loads 102 respectively.

FIG. 11 should be viewed with FIGS. 10A, 10B and 10C. The functions performed by server 1005 can also be performed by a power controller or a PCS as long as the power controller or the PCS has adequate processing power, storage, and network connectivity.

The processes start at step 1100. At step 1101, server 1005 tries to authenticate a user, such as one of Users 1008. The user authentication information can be stored locally at a local storage medium of server 1005 or remotely at a remote database or server. If the authentication fails, the process will end at step 1123.

At step 1102, if there is an electric vehicle charger available now, server 1005 informs the user of the location of the electric vehicle charger. Therefore, the user can drive his electric vehicle to the charging parking space according to the location given. In one variant, instead of informing the location of the charging space, the user can enter the location of the charging space to server 1005.

Server 1005 can then instruct power controller or PCS to enable the respective relay to provide electricity to the load. For illustration purpose, load 102*b* is the load that is connected to the scheduled electric vehicle charger, which is located at the charging parking space "Level 3, spot 510", and is the location informed to the user at step 1105, then the server 1005 sends a message to power controller 201 to enable relay 103*b*. When the user has connected his electric vehicle to a scheduled electric vehicle charger, the electric vehicle can then start being charged at step 1109*a*. At step 1119, the charging is completed, server 1005 may determine whether the charging is completed by the amount of current being drawn by the respective load i.e. the electric vehicle charger, such as load 102*b*. For illustration purpose, when there is no electric vehicle being charged, the amount of current being drawn by the electric vehicle charger is about 0.5 A before step 1109*a* is performed. During step 1109*a*, the amount of current being drawn should be more than 0.5 A, such as 1A to 50A. When the charging is complete, the amount of current should be dropped back to be about 0.5 A. Therefore, server 1005, power controller 201 and/or PCS are able to determine that the charging is complete at step 1119. In one variant, the charging is stopped even if the electric vehicle is not fully charged due to the many reasons discussed earlier when decision is made at step 604. In one variant, the charging is stopped because of the expiration of time reservation. For example, the user only reserved 30 minutes and 30 minutes has gone but the electric vehicle is still not fully charged. In one variant, the charging is stopped because of lack of money in the user's account or pre-approved payment.

At step 1120, server 1005 reports the amount of current being used and the payment amount to the user. The reporting can be performed by sending a SMS, an electronic message, sending an email or mailing a letter to the user.

When there is no electric vehicle charger available, server 1005 will inform the user about the lack of electric vehicle chargers and provide the available time slots for reservation. There is no limitation that step 1106 must be performed when no electric vehicle charger for charging is available. Step 1106 can also be performed after step 1101 when the user is not intended to use an electric vehicle charger immediately. At step 1107, the user is asked if he wants to reserve a time slot. If he does not, then the process will end at step 1123. If a time slot is required, he can reserve a time slot at step 1108. The reservation can follow the descriptions about time scheduler 800. Therefore, priority is also allowed.

When charging is detected to be completed at step 1118, the respective relay of the electric vehicle charger may be disabled by power controller or PCS in order to not allow the electric vehicle charger be used by another electric vehicle or by another user. This ensures that the user will be billed correctly by the amount of electricity being used. In one variant, rather than disabling the relay after charging, the amount of current allowed being drawn may be reset to the level that no electric vehicle is being charged. For illustration purpose, before charging is completed at step 1119, the amount of current allowed being drawn is 50 A. After step 1119, the amount of current allowed being drawn is set to 0.5 A, which is the amount of current consumed by the electric vehicle charger when not charging an electric vehicle. If it is detected that the amount of current being drawn is more than 0.5 A, the respective relay of the electric vehicle charger will be disabled.

Figure 13:
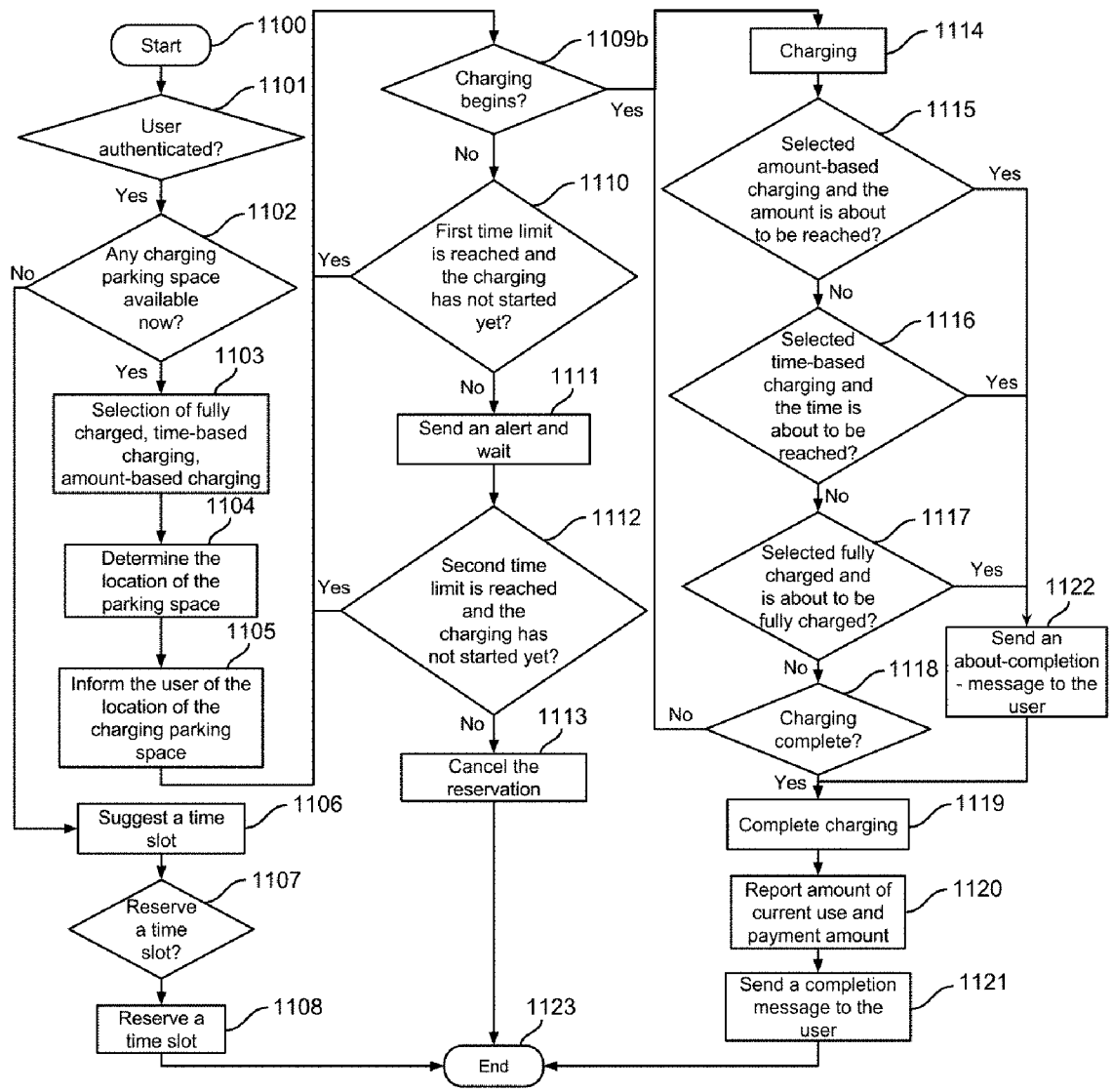
FIG. 13 is a flowchart illustrating a process performed by a server based on the FIG. 11 according to one of the embodiments of the present invention.

FIG. 13 is based on FIG. 11 and also illustrates a process performed by server 1005 according to one of the embodiments of the present invention for server 1005. Descriptions about steps 1100-1102, 1104-1108, 1119-1120 and 1123 will not be elaborated in this embodiment as they have been described earlier. For readability, descriptions about the process illustrated in FIG. 13 follows the examples described in the process illustrated in FIG. 11. At step 1103, the user can select how his electric vehicle will be charged. The user can select fully-charged, time-based charging and amount-based charging. When full-charge is selected, the charging process will not stop unless the electric vehicle is fully charged or the electric vehicle charger reports the completion of charging. When time-based charging is selected, the charging process will stop when the charging period is over. For example, if a user has selected to charge his electric vehicle from 2 pm to 3 pm. The charging process will be stopped after 3 pm. When the user selects amount-based charging, the charging process will stop when the amount of electricity provided has reached the predefined amount. For example, the user can define the amount of power, such as up to 500 kWh or by the cost accumulated, such as up to $50. When the scheduled electric vehicle charger has delivered 500 kWh or the accumulated cost is $50, the charging process will stop.

There is no limitation that the selection can only be full-charge, time-based charging and amount-based charging. For example, bidding for the charging parking space can be another selection. There is also no limitation the selection must include all three full-charge, time-based charging and amount-based charging methods. For example, the administrator may only allow time-based charging and amount-based charging methods. In another example, a user may be presented with one or two of these charging methods even when all three charging methods are available due to the user's profile or demands from other users.

At step 1109b, server 1005 determines whether the charging has begun. Server 1005 may perform a query on power controller 201 whether electricity has been provided to load 102b. If there is no electricity being provided, this indicates that the charging process has not yet begun and probably the user has not arrived at the charging parking space. If after a first time limit, such as two to ten minutes and there is still no electricity being provided to load 102b, server 1005 sends an alert at step 1111 to the user to remind him/her of the delay about initiating the charging process. Server 1005 may also remind the user about the location of the electric vehicle charger and the amount of time left before he has to commence the charging process. The amount of time left is preferred in the range from one minute to fifteen minutes in order to utilize the electric vehicle charging facility more efficiently while not causing much stress on the user. Once the amount of time left has expired and the charging process has still not commenced at step 1112, server 1005 will cancel the reservation at step 1113. The user will not be able to use any non-scheduled electric vehicle charger at the electric vehicle parking facility until another reservation is made only then an electric vehicle charger will be scheduled for him.

There is no limitation that steps 1109b-1112 must be performed after step 1102. The user may have already known the location of the electric vehicle charger after authentication and may have already selected how his electric vehicle will be charged during the reservation at step 1108. Further if the user has not authenticated or used an electric vehicle charger at the electric vehicle charging facility about the reservation time, alert messages like the ones sent out at step 1111 can also be sent to the user to remind him about the reservation.

Step 1115-1117 are used to determine when to send an about-completion-message to the user at step 1122. The about-completion-message will be sent to the user by server 1005 at step 1122 when: (i) the electric vehicle is about to be fully charged if the user has selected the vehicle to be fully-charged (ii) the charging period is about to be over if the user has selected time-based charging and (iii) the selected amount of electricity or payment predefined is about to be reached if the user has selected amount-based charging.

The about-completion-message is used to remind the user that the charging process is about to be completed. Therefore, the user can go to the electric vehicle charger to drive away his electric vehicle. This is desirable if there is a demand for the electric vehicle charger. Any delay to move the user's electric vehicle may cause inconvenience to the next user and/or reduce revenue generating opportunity. There is no limitation about the threshold to be reached before sending the about-completion-message. It is preferred to send the about-completion-message early enough for the user to arrive at the charging parking space soon after the charging is completed. For example, server 1005 can send the about-completion-message to the user five to fifteen minutes before the charging is completed.

At step 1121, a completion message is sent to the user to inform that the charging process is complete. The purpose of sending the completion message is the same as sending the about-completion-message.

There is no limitation that steps 1122 and 1121 must be performed. Steps 1122 and 1121 are optional. In one variant, a user can choose whether to receive the messages sent in steps 1122 and 1121. In one variant, instead of sending messages, other means of communication may be used. For example, a light that is close to load 102b or power controller 201 may be turned on. In one variant, lights, videos, images, audio, music, songs or sounds can be shown or played by a device controlled by server 1005 to indicate the progress of the charging progress.

There is no limitation that power controller or PCS has to be implemented in a standalone electronic device. For example, power controller or PCS can be elements of an electric vehicle charger. In another example, power controller or PCS can be elements of a networking equipment or realized by a networking equipment.

In one variant, power supply 490 provides electricity to more than one power controller or PCS. Loads 966a and 966b, power controllers 961a and 961b, and transformers 901a and 901b are connected in parallel respectively. Such that power supply 490 can provide electricity simultaneously to loads 966a and 966b. Further, for example, if power controller 961a is out of order, power controllers 961b is not affected and electricity can still be provided to load 966b. The embodiment can also be applied to prevent theft of electricity or leakage. When the total amount of current measured by ammeter 942 is more than the total current measured by ammeters 465*a* and 465*b* by an intolerant amount, there is a significant chance that electricity is leaking or being stolen. In such case, processing module 941 will then disable relay 943 to stop providing electricity to both Loads 966*a* and 966*b*. In one more detailed example, processing module 941 also sends messages to power controllers 961*a* and 961*b* to disable relays 463*a* and 463*b* respectively. Processing module 941 may also dispatch emergency staff or investigators, and they can investigate the reason behind the excessive amount of current being drawn.

The level of intolerant amount is mainly based on the total amount of current expected to be drawn by loads. For example, when power controller 961*b* has enabled relay 463*b* for providing electricity to load 966*b* while power controller 961*a* has disabled relay 463*a*, the total amount of current expected to be drawn is the amount of current drawn by load 966*b*. The level of intolerant amount of current should be about an approximate percentage of 5% to 15%, more than the total amount of current expected to be drawn or the amount of power loss due to resistance. For illustration purpose, if the amount of current measured by ammeter 465*b* is 30 A, the level of intolerant amount can be set to about 3 A which is 10% of 30A. When the amount of current measured by ammeter 942 is more than 33 A, processing module 941 will then disable relay 943 to stop providing electricity to both Loads 966*a* and 966*b*. The level of intolerant amount can also be set to a constant, like 10A.

The invention claimed is:

1. A method for supplying electricity to a plurality of electric vehicle (EV) chargers, the method comprising:
   a. selecting an EV charger according to a schedule, wherein the EV charger is one of the plurality of EV chargers;
   b. controlling an electrically operated switch of the EV charger to allow or not to allow charging an electric vehicle according to the schedule;
   c. controlling the electrically operated switch of the EV charger not to allow charging an electric vehicle when the total amount of current supplied to the plurality of EV chargers is more than a first threshold;
   wherein each EV charger of the plurality of EV chargers comprises a data communication module; and
   wherein each EV charger of the plurality of EV chargers is capable of sending and receiving data wirelessly through the data communication module.

2. The method of claim 1, further comprising sending a message to the EV charger wirelessly; wherein the electrically operated switch of the EV charger is controlled based on the message.

3. The method of claim 2, wherein the message is sent by a remote server;
   wherein the remote server and the plurality of EV chargers are located in different locations.

4. The method of claim 1, wherein the first threshold is adjusted according to the scheduler.

5. The method of claim 1, further comprising controlling the electrically operated switch of the EV charger to allow charging an electric vehicle when the total amount of current supplied to the plurality of EV chargers is more than a second threshold and is scheduled to charge an electric vehicle.

6. The method of claim 1, wherein each EV charger of the plurality of EV chargers comprises a SIM card slot.

7. The method of claim 1, wherein the schedule comprises user identity.

8. The method of claim 1, wherein the EV charger comprises a camera for capturing images.

9. The method of claim 1, wherein the EV charger comprises at least one sensor;
   and the at least one sensor is selected from a group consisting of temperature sensors, humidity sensors, smoke detector, and fire detector.

10. A system for supplying electricity to a plurality of electric vehicle (EV) chargers, comprising a remote server and the plurality of EV chargers, wherein the remote server comprises: one or more storage mediums for storing program instructions to be executed; one or more network interfaces for sending instructions through wireless communications network; one or more processing units for executing program instructions; wherein the executing program instructions comprising:
    a. selecting an EV charger according to a schedule, wherein the EV charger is one of the plurality of EV chargers;
    b. controlling an electrically operated switch of the EV charger to allow or not to allow charging an electric vehicle according to the schedule;
    c. controlling the electrically operated switch of the EV charger not to allow charging an electric vehicle when the total amount of current supplied to the plurality of EV chargers is more than a first threshold;
    wherein each EV charger of the plurality of EV chargers comprises a data communication module; and
    wherein each EV charger of the plurality of EV chargers is capable of sending and receiving data wirelessly through the data communication module.

11. The system of claim 10, wherein the executing program instructions further comprising sending a message to the EV charger wirelessly; wherein the electrically operated switch of the EV charger is controlled based on the message.

12. The system of claim 11, wherein the message is sent by a remote server;
    wherein the remote server and the plurality of EV chargers are located in different locations.

13. The system of claim 10, wherein the first threshold is adjusted according to the scheduler.

14. The system of claim 10, wherein the executing program instructions further comprising controlling the electrically operated switch of the EV charger to allow charging an electric vehicle when the total amount of current supplied to the plurality of EV chargers is more than a second threshold and is scheduled to charge an electric vehicle.

15. The system of claim 10, wherein each EV charger of the plurality of EV chargers comprises a SIM card slot.

16. The system of claim 10, wherein the EV charger is selected according to user identity.

17. The system of claim 10, wherein the EV charger comprises a camera for capturing images.

18. The system of claim 10, wherein the EV charger comprises at least one sensor;
    and the at least one sensor is selected from a group consisting of temperature sensors, humidity sensors, smoke detector, and fire detector.

19. A method for supplying electricity to a plurality of electric vehicle (EV) chargers, comprising:
    a. when the total amount of current supplied to the plurality of EV chargers is not more than a first threshold, allowing all EV chargers in the plurality of EV chargers to charge electric vehicles;

b. when the total amount of current supplied to the plurality of EV chargers is more than a first threshold, not allowing an EV charger to charge an electric vehicle;

wherein each EV charger of the plurality of EV chargers comprises an electrically operated switch;

wherein the electrically operated switch is for controlling the EV charger to allow or not to allow charging an electric vehicle;

wherein each EV charger of the plurality of EV chargers comprises a data communication module;

wherein each EV charger of the plurality of EV chargers is capable of sending and receiving data wirelessly through the data communication module; and wherein at least one of the plurality of EV chargers comprises at least one sensor; and the at least one sensor is selected from a group consisting of temperature sensors, humidity sensors, smoke detector, and fire detector.

20. The method of claim 19, wherein the EV charger is selected according to a schedule, an administrator's decision, an authentication failure, or an environmental factor.

* * * * *